United States Patent
Lee et al.

(10) Patent No.: US 11,714,579 B2
(45) Date of Patent: *Aug. 1, 2023

(54) NONVOLATILE MEMORY DEVICE SUPPORTING HIGH-EFFICIENCY I/O INTERFACE

(71) Applicant: Samsung Electronics Co., Ltd., Suwon-si (KR)

(72) Inventors: Seonkyoo Lee, Hwaseong-si (KR); Jeongdon Ihm, Seongnam-si (KR); Chiweon Yoon, Seoul (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/828,176

(22) Filed: May 31, 2022

(65) Prior Publication Data
US 2022/0291871 A1 Sep. 15, 2022

Related U.S. Application Data

(63) Continuation of application No. 17/168,620, filed on Feb. 5, 2021, now Pat. No. 11,372,593.

(30) Foreign Application Priority Data

Jul. 13, 2020 (KR) .................. 10-2020-0086227

(51) Int. Cl.
| | | |
|---|---|---|
| *G06F 3/06* | (2006.01) | |
| *G06F 1/06* | (2006.01) | |
| *G06F 13/16* | (2006.01) | |
| *G11C 16/04* | (2006.01) | |
| *G11C 16/10* | (2006.01) | |
| *G11C 16/26* | (2006.01) | |

(52) U.S. Cl.
CPC .............. *G06F 3/0659* (2013.01); *G06F 1/06* (2013.01); *G06F 3/0613* (2013.01);
(Continued)

(58) Field of Classification Search
CPC ........ G06F 3/0659; G06F 1/06; G06F 3/0613; G06F 3/0679; G06F 13/1668;
(Continued)

(56) References Cited

U.S. PATENT DOCUMENTS 5,822,251 A 10/1998 Bruce et al.
6,385,688 B1 * 5/2002 Mills ................... G06F 12/0607
  711/100

(Continued)

FOREIGN PATENT DOCUMENTS

KR  100957224 B1  5/2010

*Primary Examiner* — Fernando Hidalgo
(74) *Attorney, Agent, or Firm* — Muir Patent Law, PLLC

(57) ABSTRACT

A nonvolatile memory device includes a first pin that receives a first signal, a second pin that receives a second signal, third pins that receive third signals, a fourth pin that receives a write enable signal, a memory cell array, and a memory interface circuit that obtains a command, an address, and data from the third signals in a first mode and obtains the command and the address from the first signal and the second signal and the data from the third signals in a second mode. In the first mode, the memory interface circuit obtains the command from the third signals and obtains the address from the third signals. In the second mode, the memory interface circuit obtains the command from the first signal and the second signal and obtains the address from the first signal and the second signal.

20 Claims, 28 Drawing Sheets

(52) U.S. Cl.
CPC ........ *G06F 3/0679* (2013.01); *G06F 13/1668* (2013.01); *G11C 16/0483* (2013.01); *G11C 16/10* (2013.01); *G11C 16/26* (2013.01)

(58) Field of Classification Search
CPC ............. G06F 13/1657; G06F 13/4269; G11C 16/0483; G11C 16/10; G11C 16/26; G11C 16/32; G11C 2216/30
USPC ........................................................ 711/103
See application file for complete search history.

(56) References Cited

U.S. PATENT DOCUMENTS

| | | | |
|---|---|---|---|
| 7,764,551 B2 | 7/2010 | Seo et al. | |
| 7,916,557 B2 | 3/2011 | Abedifard | |
| 8,595,411 B2 | 11/2013 | Selinger et al. | |
| 9,350,386 B2* | 5/2016 | Park | H03M 13/05 |
| 9,418,001 B2 | 8/2016 | Alam et al. | |
| 9,703,702 B2 | 7/2017 | Tam | |
| 11,127,441 B1* | 9/2021 | Utsumi | G11C 5/025 |
| 11,372,593 B2* | 6/2022 | Lee | G11C 7/109 |
| 2011/0161554 A1* | 6/2011 | Selinger | G06F 13/1668 711/E12.001 |
| 2013/0265826 A1* | 10/2013 | Lee | G06F 13/1694 365/185.23 |
| 2021/0193235 A1* | 6/2021 | Bang | G11C 29/028 |
| 2021/0280260 A1* | 9/2021 | Shiino | G11C 16/344 |
| 2021/0295916 A1* | 9/2021 | Li | G11C 16/32 |
| 2021/0373810 A1* | 12/2021 | Cho | G06F 3/0679 |
| 2021/0390065 A1* | 12/2021 | Chung | G06F 11/3055 |
| 2021/0397553 A1* | 12/2021 | Park | G06F 12/0868 |
| 2022/0013188 A1* | 1/2022 | Kim | G11C 29/14 |

* cited by examiner

# NONVOLATILE MEMORY DEVICE SUPPORTING HIGH-EFFICIENCY I/O INTERFACE

CROSS-REFERENCE TO RELATED APPLICATIONS

This application is a continuation application of U.S. patent application Ser. No. 17/168,620, filed Feb. 5, 2021, which claims priority under 35 U.S.C. § 119 to Korean Patent Application No. 10-2020-0086227, filed on Jul. 13, 2020, in the Korean Intellectual Property Office, the disclosures of which are incorporated by reference herein in their entirety.

BACKGROUND

Embodiments of the present disclosure described herein relate to a semiconductor device, and more particularly, relate to a nonvolatile memory device supporting a high-efficiency input/output interface.

Nowadays, storage devices such as solid state drives (SSD) are being widely used. A storage device may correspond to a memory system that includes a nonvolatile memory device such as a flash memory and a memory controller controlling the nonvolatile memory device. The nonvolatile memory device may exchange input/output signals with the memory controller through predetermined pins in compliance with a protocol. For example, the nonvolatile memory device may receive a command and an address from the memory controller through specific input/output pins and may exchange data with the memory controller through the same input/output pins. According to the above input/output interface, data may fail to be exchanged while a command or an address is transferred, thereby causing a decrease of efficiency of the input/output interface. As such, there is a desire for an input/output interface capable of effectively transferring data between the nonvolatile memory device and the memory controller.

SUMMARY

Embodiments of the present disclosure provide a nonvolatile memory device supporting a high-efficiency input/output interface to efficiently transfer a command, an address, and data.

According to an exemplary embodiment, a nonvolatile memory device includes a first pin that receives a first signal from a memory controller, a second pin that receives a second signal from the memory controller, third pins that receive third signals from the memory controller, a fourth pin that receives a write enable signal from the memory controller, a memory cell array, and a memory interface circuit that obtains a command, an address, and data from the third signals in a first mode and obtains the command and the address from the first signal and the second signal and the data from the third signals in a second mode. In the first mode, the memory interface circuit obtains the command from the third signals received in an enable period of the first signal based on a toggle timing of the write enable signal and obtains the address from the third signals received in an enable period of the second signal based on a toggle timing of the write enable signal. In the second mode, the memory interface circuit obtains the command from the first signal and the second signal, received during a first time period including a predetermined number of cycle periods, based on a toggle timing of the write enable signal, according to the first signal having an enable state received in a first cycle period of the first time period; and obtains the address from the first signal and the second signal, received during a second time period including the predetermined number of cycle periods, based on a toggle timing of the write enable signal, according to the second signal having an enable state received in a second cycle period of the second time period.

According to an exemplary embodiment, a nonvolatile memory device includes a first pin that receives a control signal from a memory controller, a second pin that receives a write enable signal from the memory controller, third pins that receive data signals from the memory controller, a memory cell array, and a memory interface circuit. According to the control signal received during a first cycle period and a second cycle period of a time period including a predetermined number of cycle periods, the memory interface circuit obtains a command or an address from the control signal received during remaining cycle periods of the time period. When the control signal received during the first cycle period is in an enable state, the memory interface circuit obtains the command from the control signal received during the remaining cycle periods based on a toggle timing of the write enable signal. When the control signal received during the second cycle period is in an enable state, the memory interface circuit obtains the address from the control signal received during the remaining cycle periods based on a toggle timing of the write enable signal.

According to an exemplary embodiment, a nonvolatile memory device includes first pins that receive a plurality of control signals including a first control signal and a second control signal from a memory controller, a second pin that receives a write enable signal from the memory controller, third pins that receive data signals from the memory controller, and a memory interface circuit. The memory interface circuit obtains a command from the plurality of control signals received during a first time period including a predetermined number of cycle periods, based on a toggle timing of the write enable signal, according to the first control signal having an enable state received in a first cycle period of the first time period; and obtains an address from the plurality of control signals received during a second time period including the predetermined number of cycle periods, based on a toggle timing of the write enable signal, according to the second control signal having an enable state received in a second cycle period of the second time period.

According to an exemplary embodiment, a memory controller may include a first pin that transmits a first control signal to a memory device, a second pin that transmits a second control signal to the memory device, a third pin that transmits a write enable signal to the memory device, fourth pins that transmit data signals to the memory device, and a controller. As generating the first control signal of an enable state during a first cycle period of a first time period including a predetermined number of cycle periods each corresponding to one or more periods of the write enable signal, the controller generates the first control signal and the second control signal, which include a command, during remaining cycle periods of the first time period. As generating the second control signal of an enable state during a second cycle period of a second time period including the predetermined number of cycle periods, the controller generates the first control signal and the second control signal, which include an address, during remaining cycle periods of the second time period.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure may be described in detail and clearly to such an extent that a person of ordinary skill in the art easily implements the present disclosure.

Figure 1:
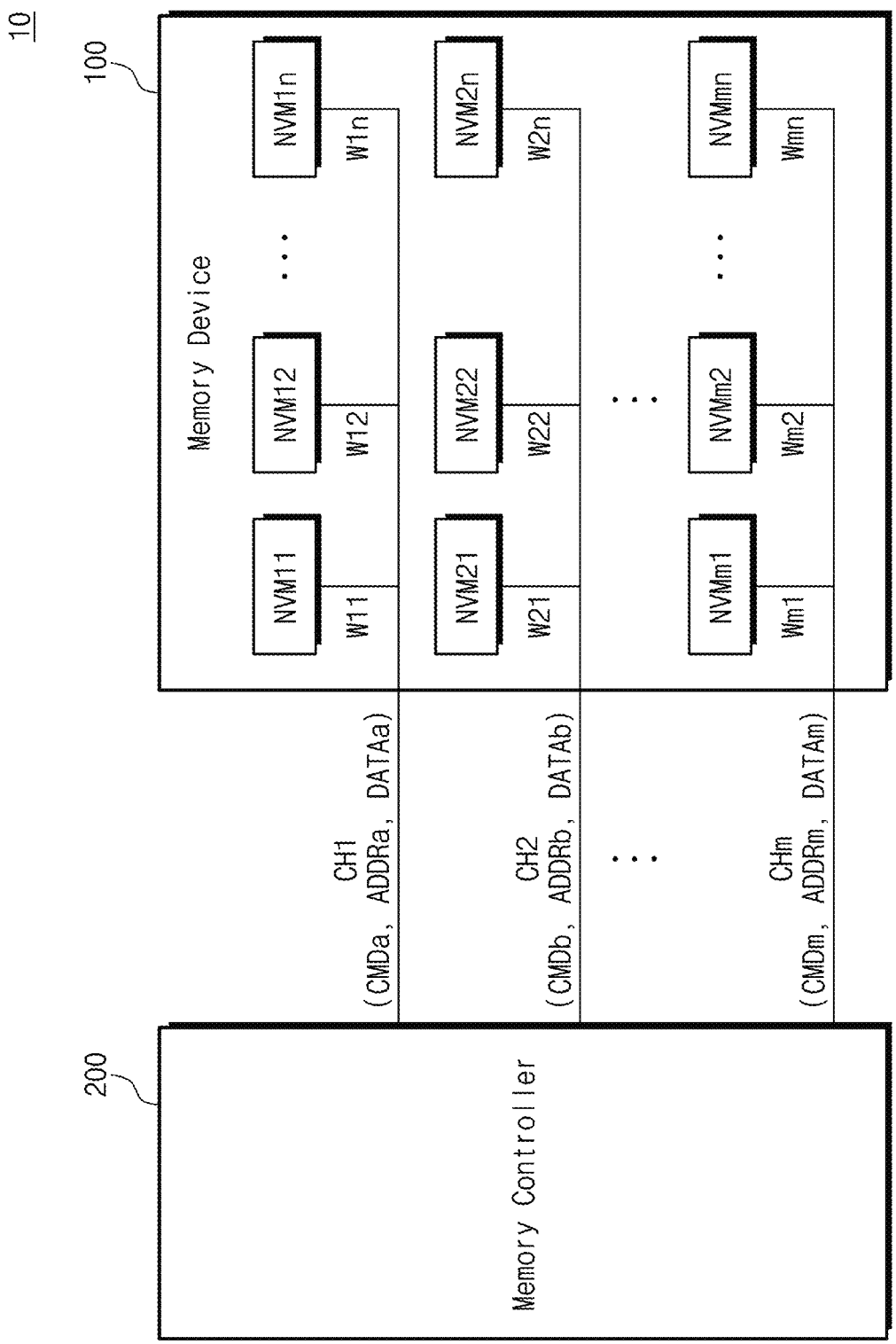
FIG. 1 is a block diagram illustrating a memory system according to an embodiment of the present disclosure.

FIG. 1 is a block diagram illustrating a memory system according to an embodiment of the present disclosure. Referring to FIG. 1, a memory system 10 may include a memory device 100 and a memory controller 200. The memory system 10 may support a plurality of channels CH1 to CHm, and the memory device 100 and the memory controller 200 may be connected through the plurality of channels CH1 to CHm. For example, the memory system 10 may be implemented with a storage device such as a solid state drive (SSD).

The memory device 100 may include a plurality of nonvolatile memory devices NVM11 to NVMmn. Each of the nonvolatile memory devices NVM11 to NVMmn may be connected with one of the plurality of channels CH1 to CHm through the corresponding way. For example, the nonvolatile memory devices NVM11 to NVM1n may be connected with the first channel CH1 through ways W11 to W1n, and the nonvolatile memory devices NVM21 to NVM2n may be connected with the second channel CH2 through ways W21 to W2n. The "ways" described herein may be, for example, conductive lines electrically connecting each nonvolatile memory device to a channel. In an exemplary embodiment, each of the nonvolatile memory devices NVM11 to NVMmn may be implemented by any memory unit capable of operating according to an individual control signal from the memory controller 200. For example, each of the nonvolatile memory devices NVM11 to NVMmn may be implemented with a semiconductor chip or a semiconductor die, but the present disclosure is not limited thereto. Each of the nonvolatile memory devices NVM11 to NVMmn may be, for example, a semiconductor package including one or more semiconductor chips or semiconductor dies. The semiconductor package may include the one or more semiconductor chips or semiconductor dies mounted on a package substrate and encapsulated with a molding layer, for example. As described herein, the term "semiconductor device" refers to a semiconductor chip or semiconductor die, or a semiconductor package.

The memory controller 200 may exchange signals with the memory device 100 through the plurality of channels CH1 to CHm. For example, the memory controller 200 may transmit commands CMDa to CMDm, addresses ADDRa to ADDRm, and data DATAa to DATAm to the memory device 100 through the channels CH1 to CHm and may receive the data DATAa to DATAm from the memory device 100.

Through each channel, the memory controller 200 may select one of nonvolatile memory devices connected with the corresponding channel and may exchange data with the selected nonvolatile memory device. For example, the memory controller 200 may select the nonvolatile memory device NVM11 of the nonvolatile memory devices NVM11 to NVM1n connected with the first channel CH1. Through the first channel CH1, the memory controller 200 may transmit the command CMDa, the address ADDRa, and the data DATAa to the selected nonvolatile memory device NVM11 and may receive the data DATAa from the selected nonvolatile memory device NVM11.

The memory controller 200 may exchange signals with the memory device 100 through different channels in parallel. For example, while the memory controller 200 transmits the command CMDa to the memory device 100 through the first channel CH1, the memory controller 200 may transmit the command CMDb to the memory device 100 through the second channel CH2. For example, while the memory controller 200 receives the data DATAa from the memory device 100 through the first channel CH1, the memory controller 200 may receive the data DATAb from the memory device 100 through the second channel CH2.

The memory controller 200 may control overall operations of the memory device 100. The memory controller 200 may transmit signals to the channels CH1 to CHm and may control the nonvolatile memory devices NVM11 to NVMmn connected with the channels CH1 to Chm, respectively. For example, the memory controller 200 may transmit the command CMDa and the address ADDRa to the first channel CH1 and may control one selected from the nonvolatile memory devices NVM11 to NVM1n.

Each of the nonvolatile memory devices NVM11 to NVMmn may operate under control of the memory controller 200. For example, the nonvolatile memory device NVM11 may receive the command CMDa, the address ADDRa, and the data DATAa provided to the first channel CH1 and may program the data DATAa based on the command CMDa and the address ADDRa. For example, the nonvolatile memory device NVM21 may read the data DATAb based on the command CMDb and the address ADDRb provided to the second channel CH2 and may transmit the read data DATAb to the memory controller 200.

An example is illustrated in FIG. 1 as the memory device 100 communicates with the memory controller 200 through m channels and the memory device 100 includes n nonvolatile memory devices for each channel, but the number of channels and the number of nonvolatile memory devices connected with one channel may be variously modified.

Figure 2:
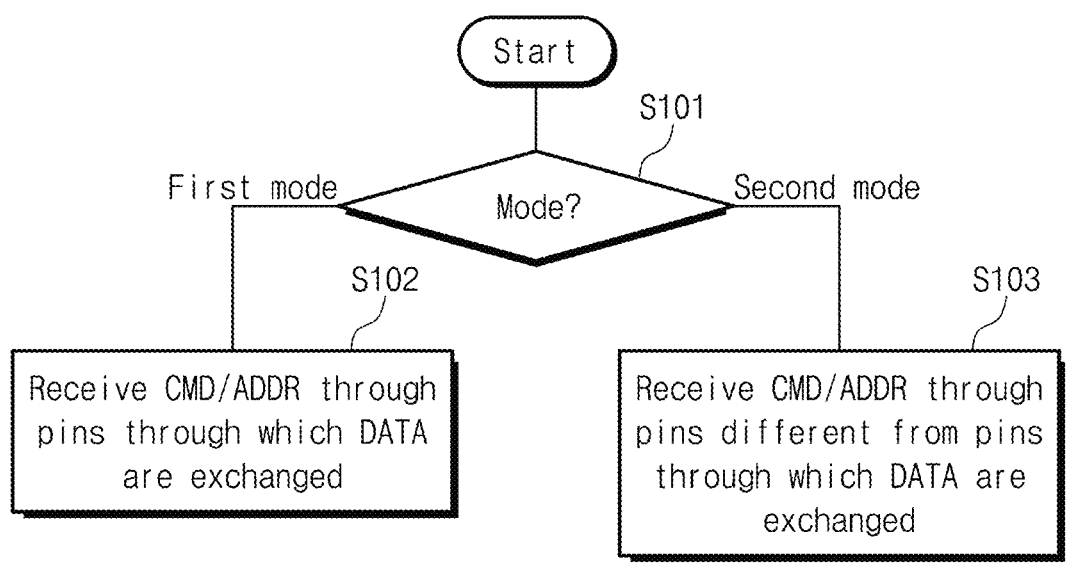
FIG. 2 is a flowchart illustrating an operation of a memory device of FIG. 1.

FIG. 2 is a flowchart illustrating an operation of a memory device of FIG. 1. Referring to FIGS. 1 and 2, in operation S101, a mode of the memory device 100 may be selected. One of a first mode and a second mode may be selected as the mode of the memory device 100. For example, the memory device 100 may be set to the first mode or the second mode according to a command or a control signal (e.g., a mode selection signal transferred through a separate pin) from the memory controller 200. For another example, the memory device 100 may be set to the first mode or the second mode in a packaging process of the memory device 100.

When the memory device 100 is set to the first mode, in operation S102, the memory device 100 may receive a command CMD and/or an address ADDR (hereinafter referred to as a "command/address CMD/ADDR") through pins through which the data "DATA" are transmitted/received. For example, in the case where the data DATAa are transmitted/received through specific pins of the first channel CH1, the memory device 100 may receive the command/address CMDa/ADDRa from the memory controller 200 through the same specific pins. In the case where the memory device 100 is set to the first mode, the memory controller 200 may transmit the command/address CMD/ADDR through pins through which the data "DATA" are transmitted/received.

When the memory device 100 is set to the second mode, in operation S103, the memory device 100 may receive the command/address CMD/ADDR through pins different from the pins through which the data "DATA" are transmitted/received. For example, in the case where the data DATAa are transmitted/received through first pins of the first channel CH1, the memory device 100 may receive the command/address CMDa/ADDRa from the memory controller 200 through second pins. In the case where the memory device 100 is set to the second mode, the memory controller 200 may transmit the command/address CMD/ADDR through pins different from the pins through which the data "DATA" are transmitted/received. For example, in the case where in the memory device 100 is set to the second mode, a group of pins may be used for transmitting command/address CMD/ADDR and data "DATA," where each pin in the group is set and used to only transmit one of either command/address CMD/ADDR or data "DATA." Accordingly, in the second mode, a first set of pins may be used for transmitting command/address CMD/ADDR and not transmitting data "DATA", and a second set of pins may be used for transmitting data "DATA" and not transmitting command/address CMD/ADDR.

According to embodiments of the present disclosure, in the second mode, the memory device 100 and the memory controller 200 may exchange the command/address CMD/ADDR and the data "DATA" in parallel based on the same channel. For example, while the memory device 100 receives the data DATAa from the memory controller 200 through the first pins of the first channel CH1, the memory device 100 may receive the command/address CMDa/ADDRa from the memory controller 200 through the second pins of the first channel CH1. In contrast, in the first mode, the memory device 100 and the memory controller 200 may not exchange the command/address CMD/ADDR and the data "DATA" in parallel based on the same channel. For example, after the memory device 100 receives the data DATAa from the memory controller 200 through the specific pins of the first channel CH1, the memory device 100 may receive the command/address CMDa/ADDRa from the memory controller 200 through the same specific pins of the first channel CH1.

As described above, the memory device 100 may operate according to one selected from the first mode and the second mode, and the memory controller 200 may transmit the command/address CMD/ADDR to the memory device 100 through pins determined in advance according to the mode of the memory device 100. In an exemplary embodiment, pins through which the command/address CMD/ADDR and the data "DATA" are transmitted according to a mode may be determined in advance in compliance with a standard.

Below, examples of a memory system that operates in the first mode or the second mode selected as the mode of the memory device 100 will be more fully described with reference to FIGS. 3 to 15B.

Figure 3:
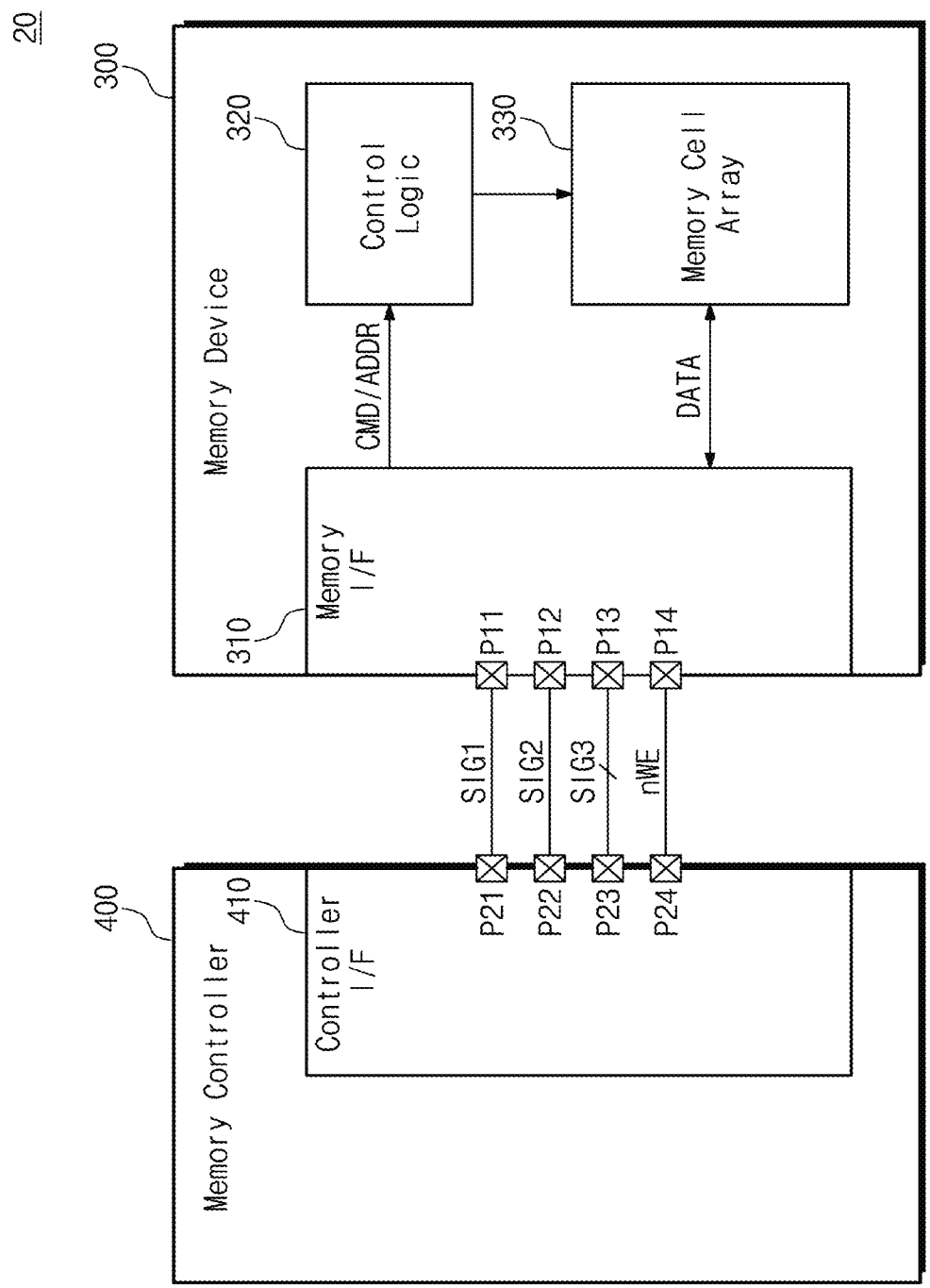
FIG. 3 is a block diagram illustrating a memory system according to an embodiment of the present disclosure.

FIG. 3 is a block diagram illustrating a memory system according to an embodiment of the present disclosure. Referring to FIG. 3, a memory system 20 may include a memory device 300 and a memory controller 400. The memory device 300 may correspond to one of the nonvolatile memory devices NVM11 to NVMmn, which communicates with the memory controller 400 based on one of the plurality of channels CH1 to CHm of FIG. 1. The memory controller 400 may correspond to the memory controller 200 of FIG. 1.

The memory device 300 may include a first pin P11, a second pin P12, third pins P13, a fourth pin P14, a memory interface circuit 310, a control logic circuit 320, and a memory cell array 330. The number pins included is given as an example only, and the memory device 300 may include a larger number of pins in different embodiments. The memory interface circuit 310 may receive a first signal SIG1, a second signal SIG2, third signals SIG3, and a write enable signal nWE through the first to fourth pins P11 to P14. The memory interface circuit 310 may receive the third signals SIG3 through the third pins P13 and may also transmit the third signals SIG3 to the memory controller 400. Each of the first pin P11, second pin P12, third pins P13, and fourth pins P14 may be an external connection terminal for the memory device, formed of a conductive material. Each pin may be, for example, a pad, a bump, or a conductive lead, and each pin may transfer signals to and from the memory device 300.

The write enable signal nWE may maintain a static state (e.g., a high level or a low level) and may then toggle between the high level and the low level in a specific period. For example, the write enable signal nWE may toggle in a period where the command CMD or the address ADDR is transmitted from the memory controller 400 or received by the memory device 300. In this case, the memory interface circuit 310 may obtain the command CMD or the address ADDR based on the write enable signal nWE.

In the first mode, the memory interface circuit 310 may obtain the command/address CMD/ADDR from the third signals SIG3. The memory interface circuit 310 may obtain the command CMD from the third signals SIG3 received in an enable period of the first signal SIG1 (e.g., in a state where the first signal SIG1 is at the high level), based on toggle timings of the write enable signal nWE. The memory interface circuit 310 may obtain the address ADDR from the third signals SIG3 received in an enable period of the second signal SIG2 (e.g., in a state where the second signal SIG2 is at the high level), based on the toggle timings of the write enable signal nWE. In this case, the first signal SIG1 may be referred to as a "command latch enable signal CLE", and the second signal SIG2 may be referred to as an "address latch enable signal ALE".

In the second mode, the memory interface circuit 310 may obtain the command/address CMD/ADDR from the first and second signals SIG1 and SIG2 based on the toggle timings of the write enable signal nWE. In an exemplary embodiment, in the case where the first signal SIG1 is in an enable state at a specific timing, the memory interface circuit 310 may obtain the command CMD from the first and second signals SIG1 and SIG2. In the case where the second signal SIG2 is in an enable state at a specific timing, the memory interface circuit 310 may obtain the address ADDR from the first and second signals SIG1 and SIG2.

Regardless of a mode, the memory interface circuit 310 may obtain the data "DATA" from the third signals SIG3 or may generate the third signals SIG3 including the data "DATA". Although not illustrated in FIG. 3, the memory interface circuit 310 may obtain the data "DATA" from the third signals SIG3 based on a data strobe signal DQS received from the memory controller 400 through a separate pin. The memory interface circuit 310 may generate the data strobe signal DQS and may transmit the third signals SIG3 including the data "DATA" to the memory controller 400 based on the data strobe signal DQS thus generated. In the manner above, the memory interface circuit 310 is configured to use the above-described first, second, and third signals SIG1, SIG2, and SIG3s as well as the write enable signal nWE, and the commands, addresses, and data obtained from those signals, to access the memory cell array 330, for example, based on control by the control logic 320, described further below.

The control logic circuit 320 may control various kinds of operations of the memory device 300. The control logic circuit 320 may receive the command/address CMD/ADDR obtained by the memory interface circuit 310. The control logic circuit 320 may generate control signals for controlling any other components of the memory device 300 according to the received command/address CMD/ADDR. For example, the control logic circuit 320 may generate various kinds of control signals for programming the data "DATA" in the memory cell array 330 or reading the data "DATA" from the memory cell array 330.

The memory cell array 330 may store the data "DATA" obtained by the memory interface circuit 310 under control of the control logic circuit 320. Under control of the memory interface circuit 310, the memory cell array 330 may output the stored data "DATA" to the memory interface circuit 310.

The memory cell array 330 may include a plurality of memory cells. For example, the plurality of memory cells may be flash memory cells. However, the present disclosure is not limited thereto. For example, the memory cells may include resistive random access memory (RRAM) cells, ferroelectric random access memory (FRAM) cells, phase change random access memory (PRAM) cells, thyristor random access memory (TRAM) cells, or magnetic random access memory (MRAM) cells. Below, embodiments of the present disclosure will be described on the basis of an embodiment where memory cells are NAND flash memory cells.

The memory controller 400 may include a first pin P21, a second pin P22, third pins P23, a fourth pin P24, and a controller interface circuit 410. The first to fourth pins P21 to P24 may correspond to the first to fourth pins P11 to P14 of the memory device 300. As such, the controller interface circuit 410 may transmit the first to third signals SIG1 to SIG3 and the write enable signal nWE through the first to fourth pins P21 to P24.

In the case where the memory device 300 is in the first mode, the controller interface circuit 410 may transmit the command/address CMD/ADDR to the memory device 300 through the third signals SIG3 and third pins P23. In the case where the memory device 300 is in the second mode, the controller interface circuit 410 may transmit the command/address CMD/ADDR to the memory device 300 through the first and second signals SIG1 and SIG2 and first and second pins P21 and P22. Regardless of a mode, the controller interface circuit 410 may transmit the data "DATA" to the memory device 300 through the third signals SIG3 and third pins P23.

Below, for convenience of description, operations of the memory device 300 in the first mode and the second mode will be described. However, this may also be applied to the memory controller 400. For example, the signals SIG1 to SIG3 and nWE that are received through the first to fourth pins P11 to P14 of the memory device 300 may be transmitted through the first to fourth pins P21 to P24 of the memory controller 400.

Figure 4:
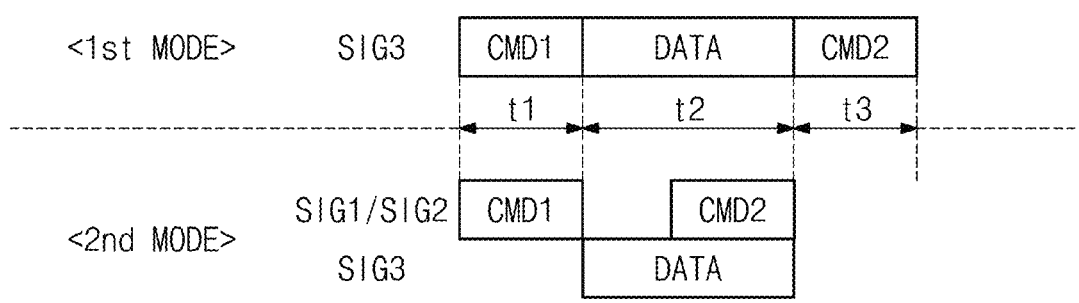
FIG. 4 is a conceptual diagram illustrating an example of signals according to a mode of a memory device of FIG. 3.

FIG. 4 is a conceptual diagram illustrating an example of signals according to a mode of a memory device of FIG. 3. Referring to FIGS. 3 and 4, in the first mode, the memory device 300 may obtain a first command CMD1 from the third signals SIG3 during a first time t1 (e.g., a first time period). During a second time t2 (e.g., a second time period), the memory device 300 may obtain the data "DATA" from the third signals SIG3 or may transmit the third signals SIG3 including the data "DATA" to the memory controller 400. For example, in the case where the first command CMD1 is a program command, the memory device 300 may receive the data "DATA" from the memory controller 400 according to the first command CMD1. In the case where the first command CMD1 is a read command, the memory device 300 may transmit the data "DATA" to the memory controller 400 according to the first command CMD1. During a third time t3 (e.g., a third time period), the memory device 300 may obtain a second command CMD2 from the third signals SIG3. Accordingly, in the first mode, the first command CMD1, the data "DATA", and the second command CMD2 may be transmitted from the memory controller 400 to the memory device 300 through the third signals SIG3 during the first to third times t1 to t3.

In the second mode, the memory device 300 may obtain the first command CMD1 from the first and second signals SIG1 and SIG2 during the first time t1 (e.g., first time period). The memory device 300 may obtain the data "DATA" from the third signals SIG3 during the second time t2 (e.g., second time period) or may transmit the third signals SIG3 including the data "DATA" to the memory controller 400 during the second time t2 (e.g., second time period). The memory device 300 may obtain the second command CMD2 from the first and second signals SIG1 and SIG2 while the data "DATA" are transmitted through the third signals SIG3. That is, in the second mode, the first command CMD1, the data "DATA", and the second command CMD2 may be transmitted to the memory controller 400 through the third signals SIG3 during the first to second times t1 to t2. That is, a time period during which the first command CMD1, the data "DATA", and the second command CMD2 are transmitted in the second mode may be shorter than a time period during which the first command CMD1, the data "DATA", and the second command CMD2 are transmitted in the first mode.

Figure 5A:
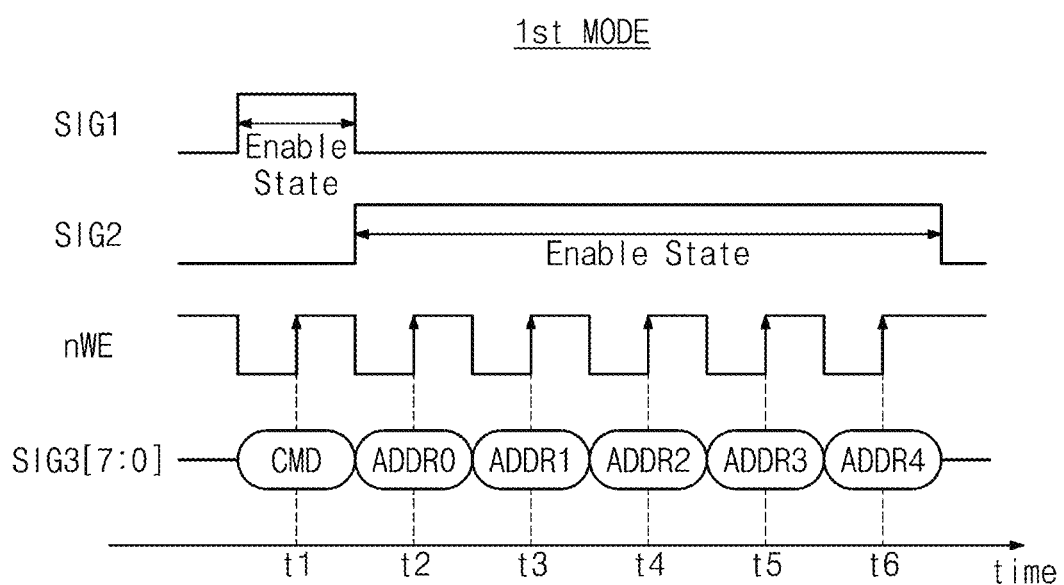
FIG. 5A is a timing diagram illustrating an example in which a memory device of FIG. 3 receives a command and an address in the first mode.
Figure 5B:
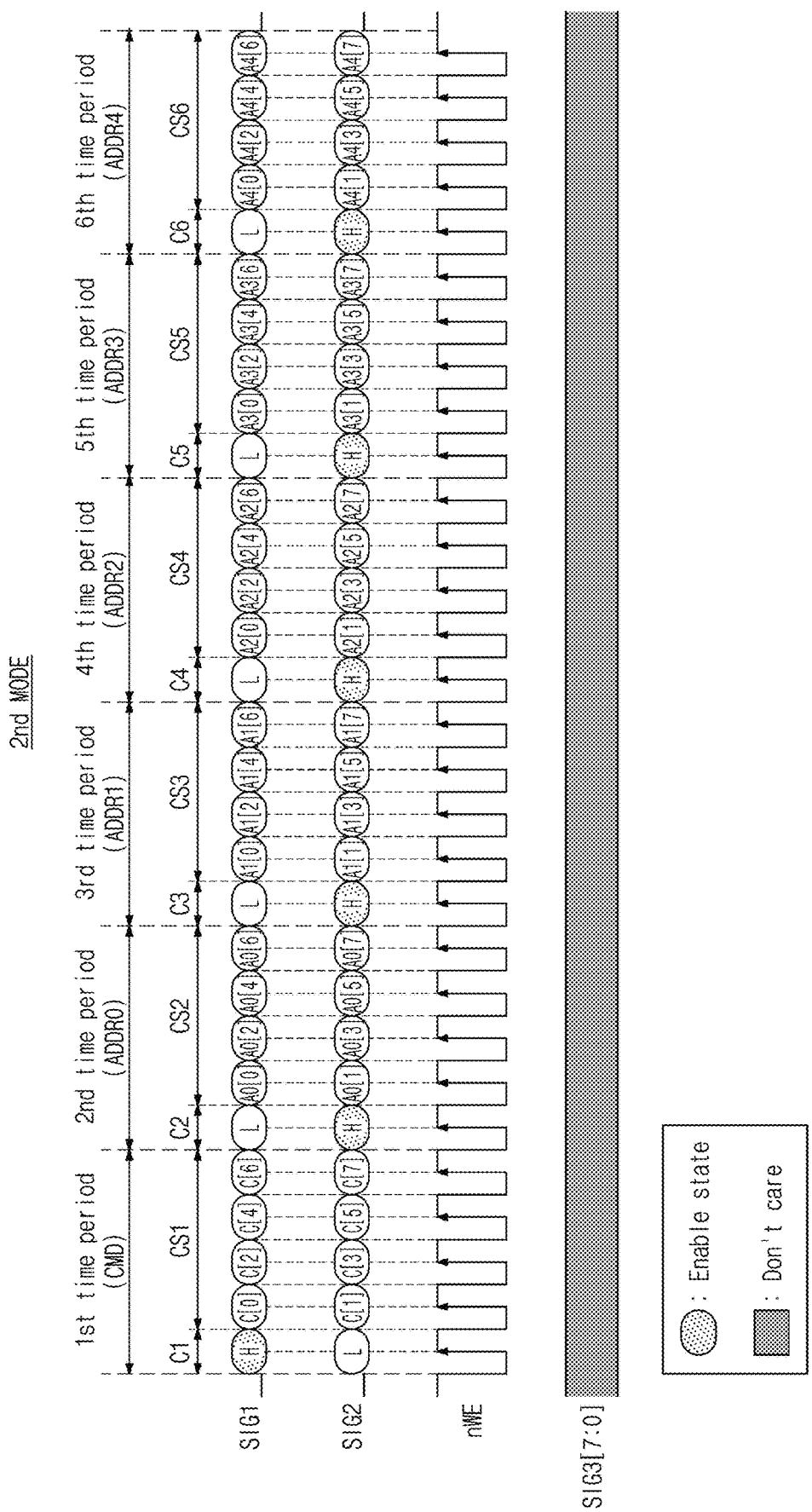
FIG. 5B is a timing diagram illustrating an example in which a memory device of FIG. 3 receives a command and an address in the second mode.

FIG. 5A is a timing diagram illustrating an example in which a memory device of FIG. 3 receives a command and an address in the first mode. FIG. 5B is a timing diagram illustrating an example in which a memory device of FIG. 3 receives a command and an address in the second mode. In detail, FIGS. 5A and 5B show examples in which the memory device 300 receives the command CMD and addresses ADDR0 to ADDR4. For example, the addresses ADDR0 and ADDR1 may constitute a column address, and the addresses ADDR2 to ADDR4 may constitute a row address. However, the present disclosure is not limited thereto. Below, as illustrated in FIGS. 5A and 5B, embodiments of the present disclosure will be described on the basis of an example where third signals SIG3[7:0] are received through 8 third pins P13 (i.e., 8 signal lines), but the present disclosure is not limited thereto.

Referring to FIGS. 3 and 5A, in the first mode, the memory device 300 may receive the third signals SIG3[7:0] including the command CMD and the addresses ADDR0 to ADDR4. While the third signals SIG3[7:0] including the command CMD and the addresses ADDR0 to ADDR4 are received, the memory device 300 may receive the write enable signal nWE toggling. For example, before obtaining the command CMD and the addresses ADDR0 to ADDR4 from the third signals SIG3[7:0] (i.e., before the first time t1), the memory device 300 may receive the write enable signal nWE starting to toggle from a static state (e.g., the high level).

The memory device 300 may obtain the command CMD from the third signals SIG3[7:0] in an enable period of the first signal SIG1 and may obtain the addresses ADDR0 to ADDR4 from the third signals SIG3[7:0] in an enable period of the second signal SIG2. For example, the memory device 300 may sample (or latch) the third signals SIG3[7:0] at rising edges of the write enable signal nWE to obtain the command CMD and the addresses ADDR0 to ADDR4. In this case, each of the command CMD and the addresses ADDR0 to ADDR4 may include 8 signal values (i.e., 8 bits) received through the 8 third pins P13 at the rising edge of the write enable signal nWE. For example, the command CMD may include signal values received through the third signals SIG3[7:0] at the first time t1, and each of the addresses ADDR0 to ADDR4 may include signal values received through the third signals SIG3[7:0] at each of second to sixth times t2 to t6.

Referring to FIGS. 3 and 5B, in the second mode, the memory device 300 may receive the first signal SIG1 and the second signal SIG2, including the command CMD and the addresses ADDR0 to ADDR4. While the first signal SIG1 and the second signal SIG2, including the command CMD and the addresses ADDR0 to ADDR4 are received, the memory device 300 may receive the write enable signal nWE toggling from the memory controller 400. For example, a toggling frequency of the write enable signal nWE received in the second mode may be greater than a toggling frequency of the write enable signal nWE received in the first mode.

A period where the command CMD and the addresses ADDR0 to ADDR4 are received may be divided into a plurality of time periods based on the write enable signal nWE. Each of the time periods may include a predetermined number of cycle periods (hereinafter, a time period including a predetermined number of cycle periods is referred to as a "predetermined time period" and may also be referred to as a "control signal time period"), and one cycle period may correspond to one or more periods of the write enable signal nWE. For example, as illustrated in FIG. 5B, a period where the command CMD and the addresses ADDR0 to ADDR4 are received may be divided into first to sixth time periods, and each of the first to sixth time periods may include 5 cycle periods. In this case, one cycle period may correspond to one period of the write enable signal nWE. However, this is just one example, and where other numbers signals are used for commands and addresses, each control signal time period may have a more than 5 cycle periods, or less than 5 cycle periods.

The memory device 300 may obtain the command CMD or the address ADDR from the first signal SIG1 and the second signal SIG2 that are received during the predetermined time period (e.g., one of the first to sixth time periods). In the case where the first signal SIG1 received during a specific cycle period of the predetermined time period is in an enable state (e.g., at the high level "H"), the memory device 300 may obtain the command CMD from the first signal SIG1 and the second signal SIG2 received in the predetermined time period. In the case where the second signal SIG2 received during a specific cycle period of the predetermined time period is in the enable state, the memory device 300 may obtain the address ADDR from the first signal SIG1 and the second signal SIG2 received in the predetermined time period.

For example, in the case where the first signal SIG1 received during a first cycle period C1 of the first time period is in the enable state (e.g., at the high level "H"), the memory device 300 may obtain the command CMD from the first signal SIG1 and the second signal SIG2 received during the remaining cycle periods CS1 of the first time period. In this case, the second signal SIG2 received during the first cycle period C1 may be in a disable state (e.g., the low level "L"). The memory device 300 may obtain the command CMD from 8 signal values C[0] to C[7] of the first signal SIG1 and the second signal SIG2 sampled at rising edges of the write enable signal nWE during the remaining cycle periods CS1. The signal values C[0] to C[7] of the first signal SIG1 and the second signal SIG2 may correspond to signal values of the third signals SIG3[7:0] sampled at the first time t1 of FIG. 5A.

For example, in the case where the write enable signal nWE changes from the static state to a toggle state, the first cycle period C1 may correspond to a first rising edge of the write enable signal nWE. However, the present disclosure is not limited thereto. For example, a rising edge of the write enable signal nWE corresponding to the first cycle period C1 may vary in compliance with a protocol.

For example, in the case where the second signal SIG2 received during a second cycle period C2 of the second time period is in the enable state (e.g., at the high level "H"), the memory device 300 may obtain the address ADDR0 from the first signal SIG1 and the second signal SIG2 received during the remaining cycle periods CS2 of the second time period. In this case, the first signal SIG1 received during the second cycle period C2 may be in the disable state (e.g., the low level "L"). The memory device 300 may obtain the address ADDR0 from 8 signal values A0[0] to A0[7] of the first signal SIG1 and the second signal SIG2 sampled at rising edges of the write enable signal nWE during the remaining cycle periods CS2. The signal values A0[0] to A0[7] of the first signal SIG1 and the second signal SIG2 may correspond to signal values of the third signals SIG3[7:0] sampled at the second time t2 of FIG. 5A. Likewise, the memory device 300 may obtain the addresses ADDR1 to ADDR4 from the first signal SIG1 and the second signal SIG2 received in the third to sixth time periods.

While the first signal SIG1 and the second signal SIG2 are received, each of the third signals SIG3[7:0] may be in a "don't care" state. For example, each of the third signals SIG3[7:0] may have at least one of the low level, the high level, or a high-impedance (high-z) state. In the case where each of the third signals SIG3[7:0] is at the low level or the high level, a value of each of the third signals SIG3[7:0] may be a valid value or an invalid value. For example, while the command CMD or the addresses ADDR0 to ADDR4 are received through the first signal SIG1 and the second signal SIG2, in the case where the memory device 300 receives the data "DATA" through the third signals SIG3[7:0], each of the third signals SIG3[7:0] may include a valid data value.

An example where the command CMD or the address ADDR is obtained from the first signal SIG1 and the second signal SIG2 received during a specific cycle period of the predetermined time period is described with reference to FIG. 5A, but the present disclosure is not limited thereto. In an exemplary embodiment, in the case where the first signal SIG1 received during the first cycle period of the predetermined time period is in the enable state, the memory device 300 may obtain the command CMD from the first signal SIG1 and the second signal SIG2 received in the predetermined time period; in the case where the second signal SIG2 received during the second cycle period of the predetermined time period is in the enable state, the memory device 300 may obtain the address ADDR from the first signal SIG1 and the second signal SIG2 received in the predetermined time period. In another exemplary embodiment, in the case where the first signal SIG1 received during the first cycle period of the predetermined time period is in the enable state, the memory device 300 may obtain the command CMD from the first signal SIG1 and the second signal SIG2 received in the predetermined time period; in the case where the first signal SIG1 received during the second cycle period of the predetermined time period is in the enable state, the memory device 300 may obtain the address ADDR from the first signal SIG1 and the second signal SIG2 received in the predetermined time period. That is, the present disclosure may include various embodiments capable of recognizing (or determining) the command CMD or the address ADDR received in the predetermined time period.

Figure 6:
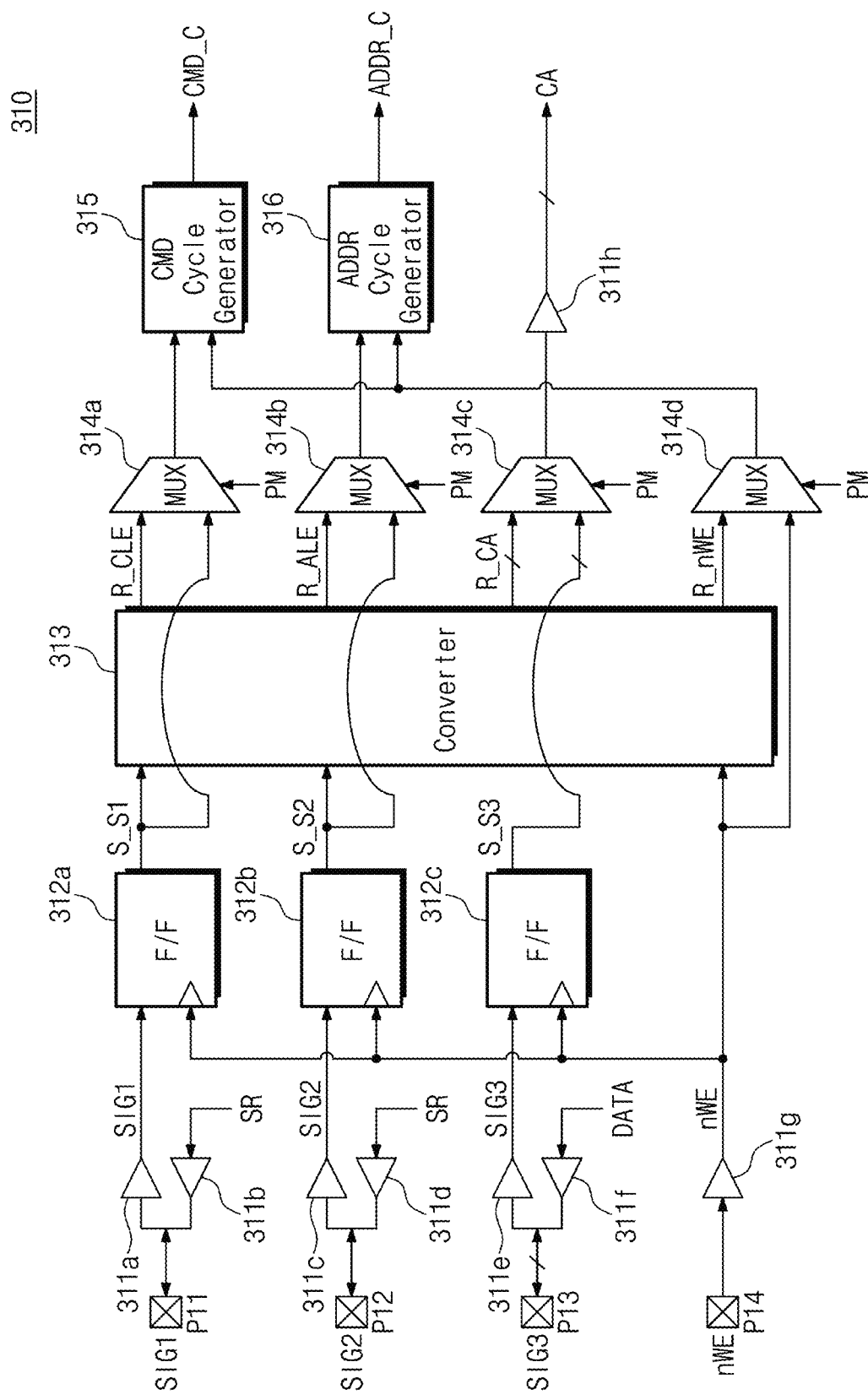
FIG. 6 is a block diagram illustrating an example of a memory interface circuit of FIG. 3.

FIG. 6 is a block diagram illustrating an example of a memory interface circuit of FIG. 3. In detail, FIG. 6 shows an example of the memory interface circuit 310 for receiving the command CMD and the address ADDR according to a selected mode. Referring to FIG. 6, the memory interface circuit 310 may include buffers 311a to 311h, first to third flip-flops 312a to 312c, a converter 313, first to fourth multiplexers 314a to 314d, a command cycle generator 315, and an address cycle generator 316.

The first to third signals SIG1 to SIG3 received through the first to third pins P11 to P13 may be respectively provided to the first to third flip-flops 312a to 313c through the buffers 311a, 311c, and 311e. The write enable signal nWE received through the fourth pin P14 may be provided to the first to third flip-flops 312a to 312c and the converter 313. The first to third flip-flops 312a to 312c may sample the first to third signals SIG1 to SIG3 at a rising edge of the write enable signal nWE and may output first to third sampled signals S_S1 to S_S3. The first and second sampled signals S_S1 and S_S2 may be provided to the converter 313 and the first and second multiplexers 314a and 314b, and the third sampled signals S_S3 may be provided to the third multiplexer 314c. The write enable signal nWE may be provided to the converter 313 and the fourth multiplexer 314d.

In the first mode, the first sampled signal S_S1 may include information indicating whether the third sampled signals S_S3 include the command CMD, and the second sampled signal S_S2 may include information indicating whether the third sampled signals S_S3 include the address ADDR. The third sampled signals S_S3 may include the command CMD or the address ADDR.

In the second mode, the first sampled signal S_S1 may include information indicating whether the first and second sampled signals S_S1 and S_S2 include the command CMD, and the second sampled signal S_S2 may include information indicating whether the first and second sampled signals S_S1 and S_S2 include the address ADDR. The first and second sampled signals S_S1 and S_S2 may include the command CMD or the address ADDR.

The converter 313 may generate a recovered command latch enable signal R_CLE, a recovered address latch enable signal R_ALE, recovered command/address signals R_CA, and a recovered write enable signal R_nWE by using the first and second sampled signals S_S1 and S_S2 and the write enable signal nWE. The recovered command latch enable signal R_CLE may include information indicating whether the recovered command/address signals R_CA include the command CMD, and the recovered address latch enable signal R_ALE may include information indicating whether the recovered command/address signals R_CA include the address ADDR. In the first mode, because the first and second sampled signals S_S1 and S_S2 do not include the command CMD or the address ADDR, the recovered command/address signals R_CA output from the converter 313 in the first mode may not include the command CMD or the address ADDR. In the second mode, because the first and second sampled signals S_S1 and S_S2 include the command CMD or the address ADDR, the recovered command/address signals R_CA output from the converter 313 in the second mode may include the command CMD or the address ADDR. For example, the recovered command/address signals R_CA output from the converter 313 may include valid command or address values in the second mode.

Each of the first and second sampled signals S_S1 and S_S2 provided to the converter 313 during the predetermined time period in the second mode may include serialized values of the command/address CMD/ADDR as described with reference to FIG. 5B. The converter 313 may output the serialized command/address (CMD/ADDR) values received during the predetermined time period in parallel through the recovered command/address signals R_CA. For example, the converter 313 may convert the serialized command/address (CMD/ADDR) values to deserialized command/address (CMD/ADDR) values. To output the command/address (CMD/ADDR) values in parallel, the number of signal lines through which the recovered command/address signals R_CA are transferred may be equal to the number of signal lines through which the third signals SIG3 are transferred. An operation of the converter 313 will be more fully described with reference to FIG. 7.

The first to fourth multiplexers 314a to 314d may receive the signals R_CLE, R_ALE, R_CA, and R_nWE output from the converter 313 and/or the signals S_S1, S_S2, S_S3, and nWE bypassing the converter 313. Based on a mode selection signal PM, the first to fourth multiplexers 314a to 314d may output the signals R_CLE, R_ALE, R_CA, and R_nWE received from the converter 313 or may output the bypassed signals S_S1, S_S2, S_S3, and nWE. For example, the mode selection signal PM may be provided from the memory controller 400 of FIG. 3 or may be generated in the memory device 300 according to a mode.

For example, the first to fourth multiplexers 314a to 314d may output the bypassed signals S_S1, S_S2, S_S3, and nWE based on the mode selection signal PM indicating the first mode. For example, the first to fourth multiplexers 314a to 314d may output the signals R_CLE, R_ALE, R_CA, and R_nWE received from the converter 313 based on the mode selection signal PM indicating the second mode. In this case, information of the signals R_CLE, R_ALE, R_CA, and R_nWE output in the second mode may respectively correspond to information of the signals S_S1, S_S2, S_S3, and nWE output in the first mode.

The command cycle generator 315 may generate a command cycle signal CMD_C based on a signal output from the first multiplexer 314a and a signal output from the fourth multiplexer 314d. Here, the command cycle signal CMD_C may be a signal for extracting the command CMD from command/address signals CA output from the buffer 311h. For example, in the first mode, the command cycle generator 315 may generate the command cycle signal CMD_C based on the first sampled signal S_S1 output from the first multiplexer 314a and the write enable signal nWE output from the fourth multiplexer 314d. For example, in the second mode, the command cycle generator 315 may generate the command cycle signal CMD_C based on the recovered command latch enable signal R_CLE output from the first multiplexer 314a and the recovered write enable signal R_nWE output from the fourth multiplexer 314d.

The address cycle generator 316 may generate an address cycle signal ADDR_C based on a signal output from the second multiplexer 314b and a signal output from the fourth multiplexer 314d. Here, the address cycle signal ADDR_C may be a signal for extracting the address ADDR from the command/address signals CA output from the buffer 311h. For example, in the first mode, the address cycle generator 316 may generate the address cycle signal ADDR_C based on the second sampled signal S_S2 output from the second multiplexer 314b and the write enable signal nWE output from the fourth multiplexer 314d. For example, in the second mode, the address cycle generator 316 may generate the address cycle signal ADDR_C based on the recovered address latch enable signal R_ALE output from the second multiplexer 314b and the recovered write enable signal R_nWE output from the fourth multiplexer 314d.

The third sampled signals S_S3 output from the third multiplexer 314c in the first mode may be output as the command/address signals CA through the buffer 311h. The recovered command/address signals R_CA output from the third multiplexer 314c in the second mode may be output as the command/address signals CA through the buffer 311h.

In an exemplary embodiment, the command cycle signal CMD_C and the command/address signals CA may be transferred to the control logic circuit 320 of FIG. 3 (e.g., a command decoder in the control logic circuit 320), and the control logic circuit 320 may receive the command CMD from the command/address signals CA based on the command cycle signal CMD_C. The address cycle signal ADDR_C and the command/address signals CA may be transferred to the control logic circuit 320 of FIG. 3 (e.g., an address decoder in the control logic circuit 320), and the control logic circuit 320 may receive the address ADDR from the command/address signals CA based on the address cycle signal ADDR_C.

In an exemplary embodiment, the memory interface circuit 310 may transmit status information SR of the memory device 300 to the memory controller 400 through at least one of the first pin P11 and the second pin P12 in response to a status read command from the memory controller 400. For example, as illustrated in FIG. 6, the buffers 311b and 311d may transmit the first signal SIG1 and the second signal SIG2, in which the status information SR is included, to the memory controller 400. The memory interface circuit 310 may transmit the third signals SIG3 including the data "DATA" to the memory controller 400 through the buffer 311f connected with the third pins P13. As such, in the case where the status information SR and the data "DATA" are transferred through different pins, while the data "DATA" are transferred from a first memory device (e.g., the nonvolatile memory device NVM11 of FIG. 1) to the memory controller 200 (refer to FIG. 1), status information of a second memory device (e.g., the nonvolatile memory device NVM12 of FIG. 1) may be provided from the second memory device to the memory controller 200. As such, while the data "DATA" are received from the first memory device, the memory controller 200 may provide the command/address CMD/ADDR to the second memory device based on the status information of the second memory device.

Figure 7:
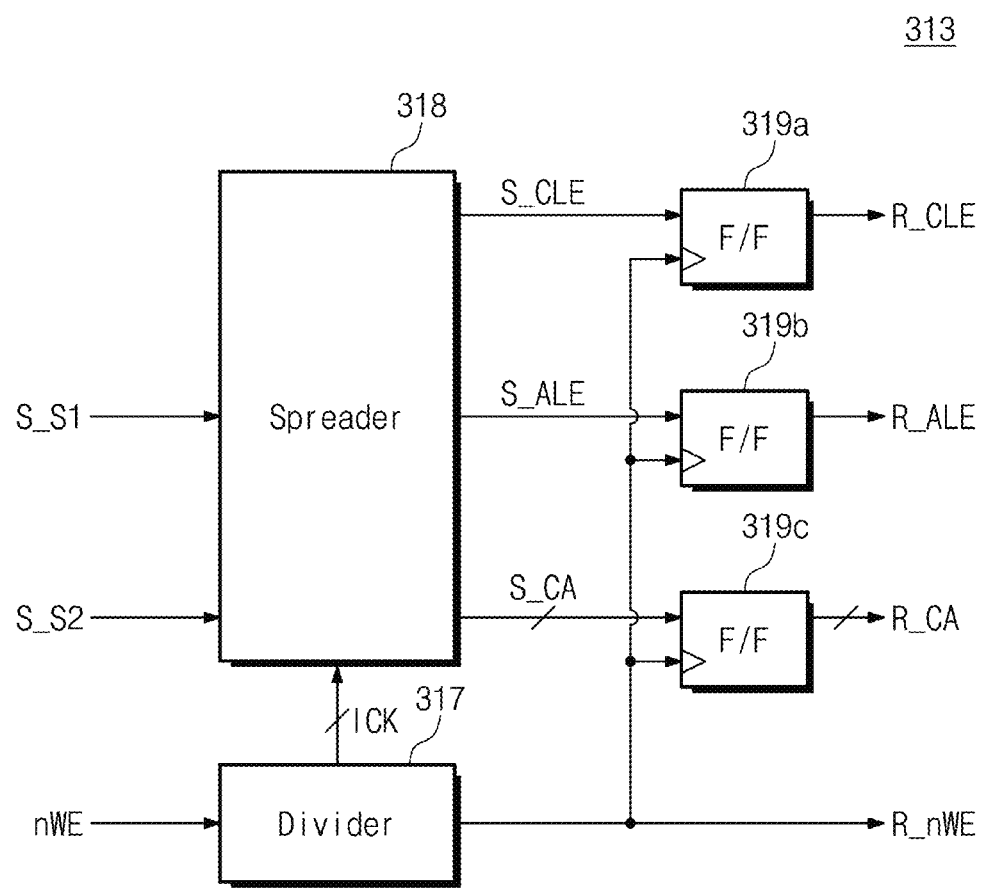
FIG. 7 is a block diagram illustrating an example of a converter of FIG. 6.

FIG. 7 is a block diagram illustrating an example of a converter of FIG. 6. As described with reference to FIG. 6, because the output signals R_CLE, R_ALE, R_CA, and R_nWE of the converter 313 have valid values in the second mode, below, operations of the converter 313 in the second mode will be described. Referring to FIG. 7, the converter 313 may include a divider 317, a spreader 318, and first to third flip-flops 319*a* to 319*c*.

The divider 317 may receive the write enable signal nWE and may divide the write enable signal nWE to generate internal clock signals ICK having different phases. For example, the number of internal clock signals ICK may be equal to the number of cycles included in the predetermined time period. A period of each of the internal clock signals ICK may correspond to the predetermined time period. The internal clock signals ICK may be provided to the spreader 318. The divider 317 may further generate the recovered write enable signal R_nWE having the same phase as one of the internal clock signals ICK. In this case, a period of the recovered write enable signal R_nWE may correspond to the predetermined time period.

The spreader 318 may sample the first sampled signal S_S1 and the second sampled signal S_S2 based on the internal clock signals ICK and may generate a sampled command latch enable signal S_CLE, a sampled address latch enable signal S_ALE, and sampled command/address signals S_CA. For example, the spreader 318 may generate the sampled command latch enable signal S_CLE from the first sampled signal S_S1 and may generate the sampled address latch enable signal S_ALE from the second sampled signal S_S2. The spreader 318 may generate the sampled command/address signals S_CA from the first sampled signal S_S1 and the second sampled signal S_S2.

For example, the spreader 318 may sample the first sampled signal S_S1 and the second sampled signal S_S2, including serialized command/address (CMD/ADDR) values at different edge timings of the internal clock signals ICK. As such, the command/address (CMD/ADDR) values may be sampled from the first sampled signal S_S1 and the second sampled signal S_S2. The spreader 318 may output the sampled command/address signals S_CA including the sampled command/address (CMD/ADDR) values through signal lines, the number of which is equal to the number of signal lines of the third signals SIG3 of FIG. 6. In this case, because the command/address (CMD/ADDR) values are respectively output through the corresponding signal lines according to edge timings of the internal clock signals ICK, the command/address (CMD/ADDR) values of the sampled command/address signals S_CA may not be aligned at one timing.

The first to third flip-flops 319*a* to 319*c* may sample the sampled signals S_CLE, S_ALE, and S_CA at a rising edge (or a falling edge) of the recovered write enable signal R_nWE to output the recovered signals R_CLE, R_ALE, and R_CA. The third flip-flop 319*c* may receive the sampled command/address signals S_CA including the command/address (CMD/ADDR) values during the predetermined time period and may sample the received command/address (CMD/ADDR) values at an edge timing of the recovered write enable signal R_nWE. The third flip-flop 319*c* may output the recovered command/address signals R_CA including the sampled command/address (CMD/ADDR) values at one timing. As such, the third flip-flop 319*c* may output the sampled command/address (CMD/ADDR) values through the recovered command/address signals R_CA in parallel.

Figure 8:
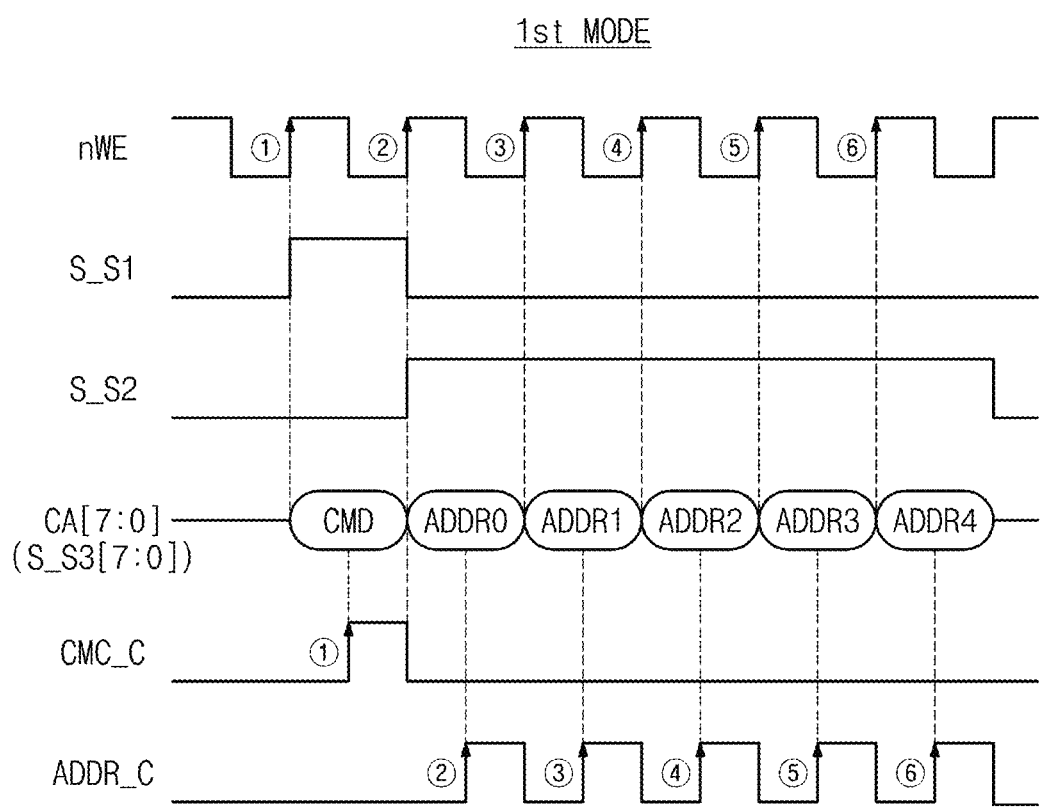
FIG. 8 is a timing diagram illustrating an example of signals generated at a memory interface circuit of FIG. 6 in the first mode.

FIG. 8 is a timing diagram illustrating an example of signals generated at a memory interface circuit of FIG. 6 in the first mode. Referring to FIGS. 5A, 6, and 8, the first to third flip-flops 312*a* to 312*c* may respectively sample the first to third signals SIG1 to SIG3 at rising edges of the write enable signal nWE and may generate the first sampled signal S_S1, the second sampled signal S_S2, and the third sampled signals S_S3[7:0]. In the first mode, the third sampled signals S_S3[7:0] may be output as command/address signals CA[7:0].

The command cycle generator 315 may generate the command cycle signal CMD_C toggling during an enable period (e.g., logical high) of the first sampled signal S_S1 based on a rising edge of the write enable signal nWE. For example, as illustrated in FIG. 8, the command cycle generator 315 may generate the command cycle signal CMD_C having one rising edge (labeled ①) corresponding to the first rising edge (labeled ①) of the write enable signal nWE.

The address cycle generator 316 may generate the address cycle signal ADDR_C toggling during an enable period (e.g., logical high) of the second sampled signal S_S2 based on a rising edge of the write enable signal nWE. For example, as illustrated in FIG. 8, the address cycle generator 316 may generate the address cycle signal ADDR_C having 5 rising edges (numbered (②) to ⑥) respectively corresponding to the second to sixth rising edges (numbered ② to ⑥) of the write enable signal nWE.

As described above, in the first mode, the memory interface circuit 310 may generate the command cycle signal CMD_C, the address cycle signal ADDR_C, and the command/address signals CA[7:0] corresponding to 8 signal lines. In this case, the command CMD may be extracted from the command/address signals CA[7:0] based on the command cycle signal CMD_C, and the addresses ADDR0 to ADDR4 may be extracted from the command/address signals CA[7:0] based on the address cycle signal ADDR_C.

Figure 9:
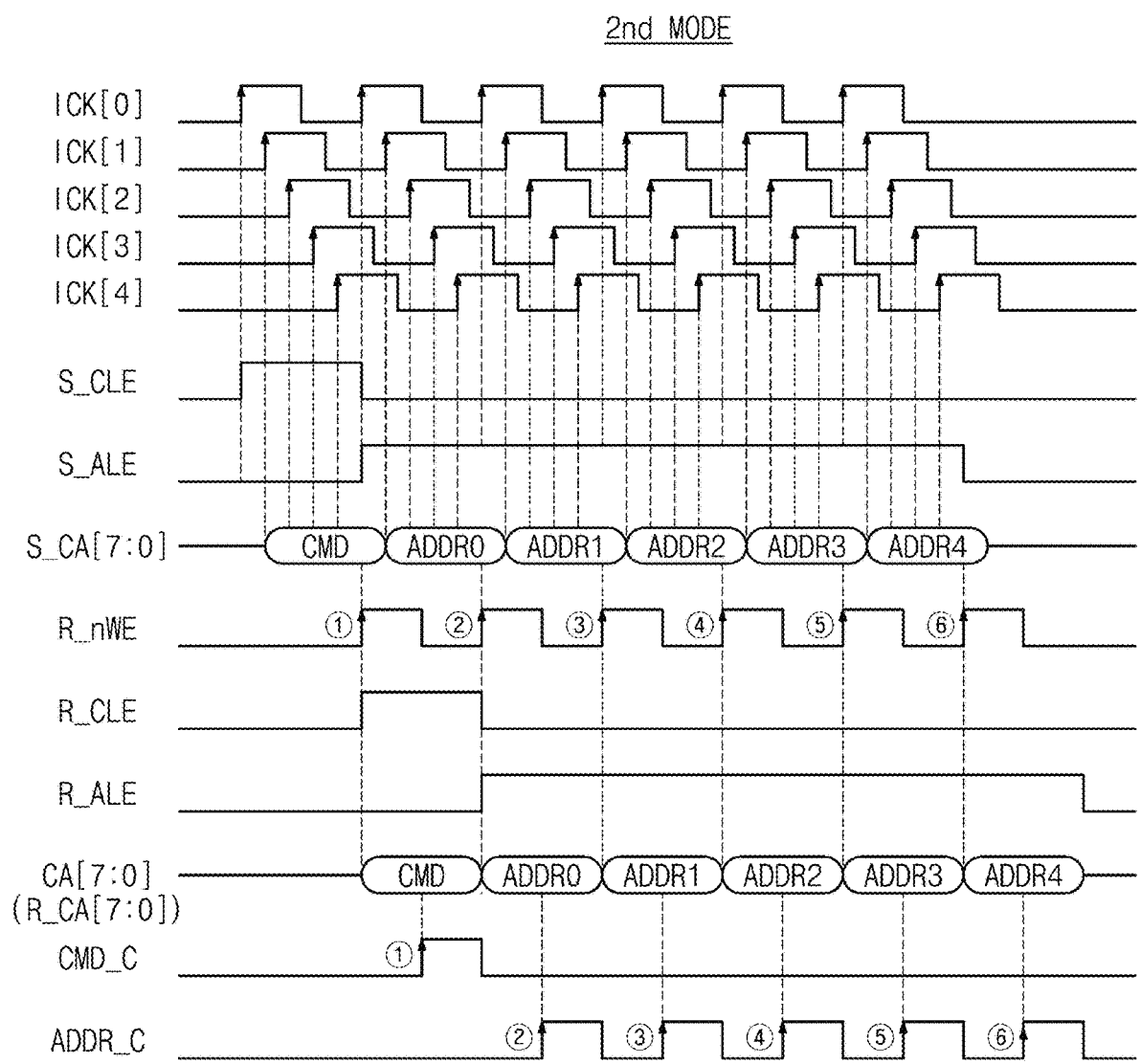
FIG. 9 is a timing diagram illustrating an example of signals generated at a memory interface circuit of FIG. 6 in the second mode.

FIG. 9 is a timing diagram illustrating an example of signals generated at a memory interface circuit of FIG. 6 in the second mode. Referring to FIGS. 5B, 6, 7, and 9, the divider 317 may divide the write enable signal nWE to generate 5 internal clock signals ICK[0] to ICK[4] having different phases. In this case, the divider 317 may further generate the recovered write enable signal R_nWE that has the same phase as the internal clock signal ICK[0] and is delayed with respect to the internal clock signal ICK[0] as much as one period. A period of each of the internal clock signals ICK[0] to ICK[4] and the recovered write enable signal R_nWE may correspond to 5 cycles (i.e., the predetermined time period) of the write enable signal nWE.

The first sampled signal S_S1 and the second sampled signal S_S2 provided to the spreader 318 may respectively correspond to the first signal SIG1 and the second signal SIG2 of FIG. 5B delayed as much as half the period. Below, for convenience of description, it is assumed that the internal clock signals ICK[0] to ICK[4] are delayed with respect to the write enable signal nWE as much as half the period according to the first sampled signal S_S1 and the second sampled signal S_S2.

The spreader 318 may generate the sampled command latch enable signal S_CLE from the first sampled signal S_S1 based on rising edges of the internal clock signal ICK[0]. The spreader 318 may generate the sampled address latch enable signal SALE from the second sampled signal S_S2 based on the rising edges of the internal clock signal ICK[0]. The spreader 318 may generate the sampled command/address signals S_CA[7:0] from the first and second sampled signals S_S1 and S_S2 based on rising edges of the internal clock signals ICK[1] to ICK[4]. In this case, command/address (CMD/ADDR) values of the sampled command/address signals S_CA[7:0] may not be aligned at one timing according to edge timings of the internal clock signals ICK[1] to ICK[4].

The first to third flip-flops 319a to 319c may sample the sampled signals S_CLE, S_ALE, and S_CA[7:0] at rising edges of the recovered write enable signal R_nWE and may respectively output the recovered signals R_CLE, R_ALE, and R_CA[7:0]. The third flip-flop 319c may sample the command/address (CMD/ADDR) values from the sampled command/address signals S_CA[7:0] received during one period (i.e., during the predetermined time period) based on one rising edge of the recovered write enable signal R_nWE. As such, the sampled command/address (CMD/ADDR) values may be output through the recovered command/address signals R_CA[7:0] at one timing (i.e., in parallel). For example, in the second mode, the recovered command/address signals R_CA[7:0] may be output as the command/address signals CA[7:0].

The command cycle generator 315 may generate the command cycle signal CMD_C toggling during an enable period (e.g., logical high) of the recovered command latch enable signal R_CLE based on a rising edge of the recovered write enable signal R_nWE. For example, as illustrated in FIG. 9, the command cycle generator 315 may generate the command cycle signal CMD_C having one rising edge corresponding to the first rising edge of the recovered write enable signal R_nWE. For example, a toggling frequency of the command cycle signal CMD_C may be identical to a toggling frequency of the recovered write enable signal R_nWE.

The address cycle generator 316 may generate the address cycle signal ADDR_C toggling during an enable period of the recovered address latch enable signal R_ALE based on a rising edge of the recovered write enable signal R_nWE. For example, as illustrated in FIG. 9, the address cycle generator 316 may generate the address cycle signal ADDR_C having 5 rising edges respectively corresponding to the second to sixth rising edges of the recovered write enable signal R_nWE. For example, a toggling frequency of the address cycle signal ADDR_C may be identical to the toggling frequency of the recovered write enable signal R_nWE.

As described above, in the second mode, the memory interface circuit 310 may generate the command cycle signal CMD_C, the address cycle signal ADDR_C, and the command/address signals CA[7:0] corresponding to 8 signal lines. In this case, the command CMD may be extracted from the command/address signals CA[7:0] based on the command cycle signal CMD_C, and the addresses ADDR0 to ADDR4 may be extracted from the command/address signals CA[7:0] based on the address cycle signal ADDR_C.

As illustrated in FIGS. 8 and 9, regardless of a mode, the memory interface circuit 310 may generate the command cycle signal CMD_C, the address cycle signal ADDR_C, and the command/address signals CA capable of being output through signal lines, based on the first to third signals SIG1 to SIG3. As such, an internal interface circuit or a peripheral circuit (e.g., the control logic circuit 320 of FIG. 3) of the memory device 300 that receives the command cycle signal CMD_C, the address cycle signal ADDR_C, and the command/address signals CA may be implemented regardless of a mode and may operate regardless of a mode. As a result, the memory interface circuit 310 may provide compatibility such that the memory device 300 is capable of operating in the first mode and the second mode without changing the design of the internal interface circuit or the peripheral circuit.

Figure 10:
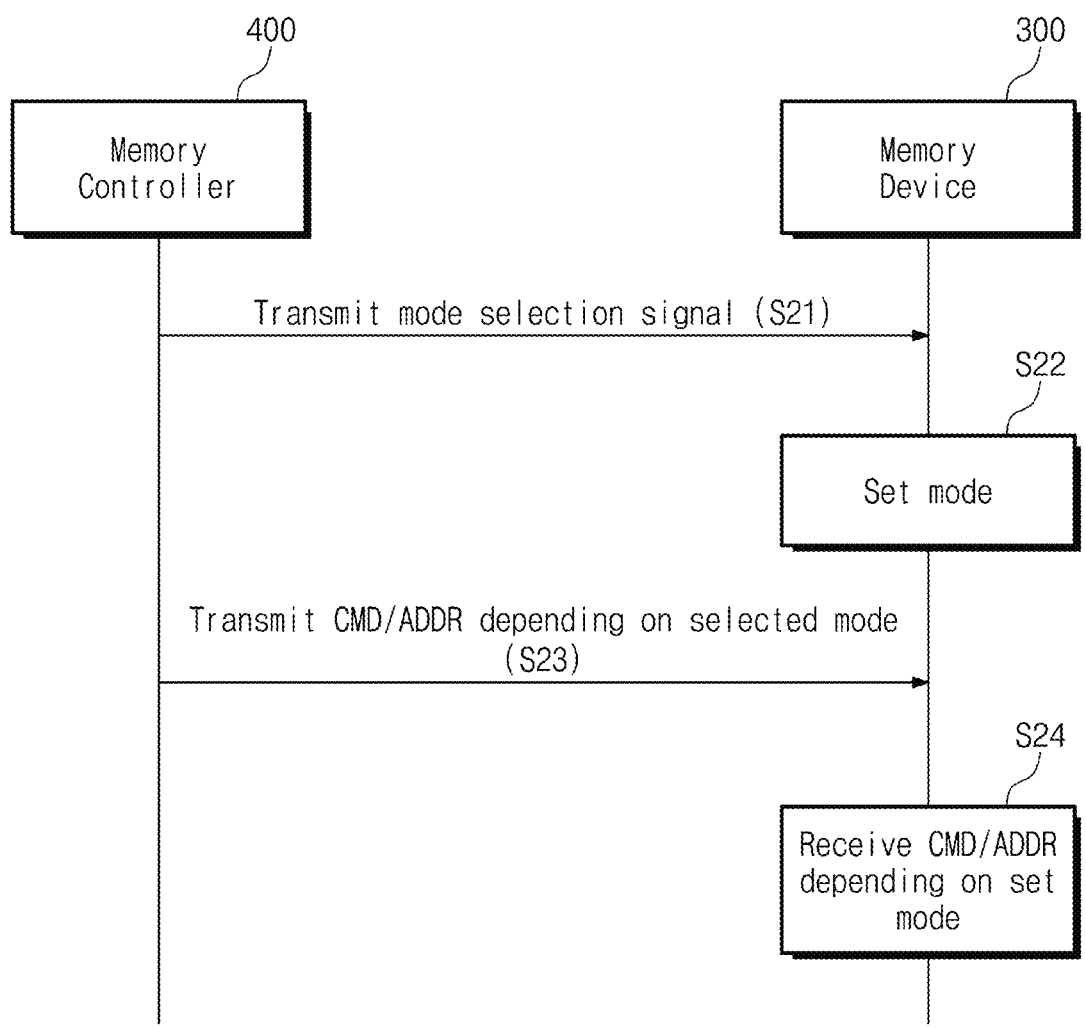
FIG. 10 is a flowchart illustrating an exemplary operation of a memory system of FIG. 3.

FIG. 10 is a flowchart illustrating an exemplary operation of a memory system of FIG. 3. Referring to FIG. 10, in operation S21, the memory controller 400 transmits a mode selection signal to the memory device 300. For example, the memory controller 400 may transmit the mode selection signal to the memory device 300 through a command (e.g., a "Set Feature" command) or a separate control signal for mode selection.

In operation S22, the memory device 300 is set to a selected mode in response to the mode selection signal. For example, the memory device 300 may store a mode setting value indicating the selected mode in a register. As such, the memory device 300 may operate according to the set mode.

In operation S23, the memory controller 400 transmits the command/address CMD/ADDR to the memory device 300 according to the selected mode. For example, in the case where the memory device 300 is set to the first mode, the memory controller 400 may transmit the command/address CMD/ADDR to the memory device 300 through the third pins P23. For example, in the case where the memory device 300 is set to the second mode, the memory controller 400 may transmit the command/address CMD/ADDR to the memory device 300 through the first and second pins P21 and P22. Therefore, for two identical commands/addresses CMD/ADDR received in different instances, different pins can be used depending on the selected mode.

In operation S24, the memory device 300 may receive the command/address CMD/ADDR from the memory controller 400 according to the set mode. For example, in the case where the memory device 300 is set to the first mode, the memory device 300 may obtain the command/address CMD/ADDR from the third signals SIG3. For example, in the case where the memory device 300 is set to the second mode, the memory device 300 may obtain the command/address CMD/ADDR from the first and second signals SIG1 and SIG2.

Figure 11:
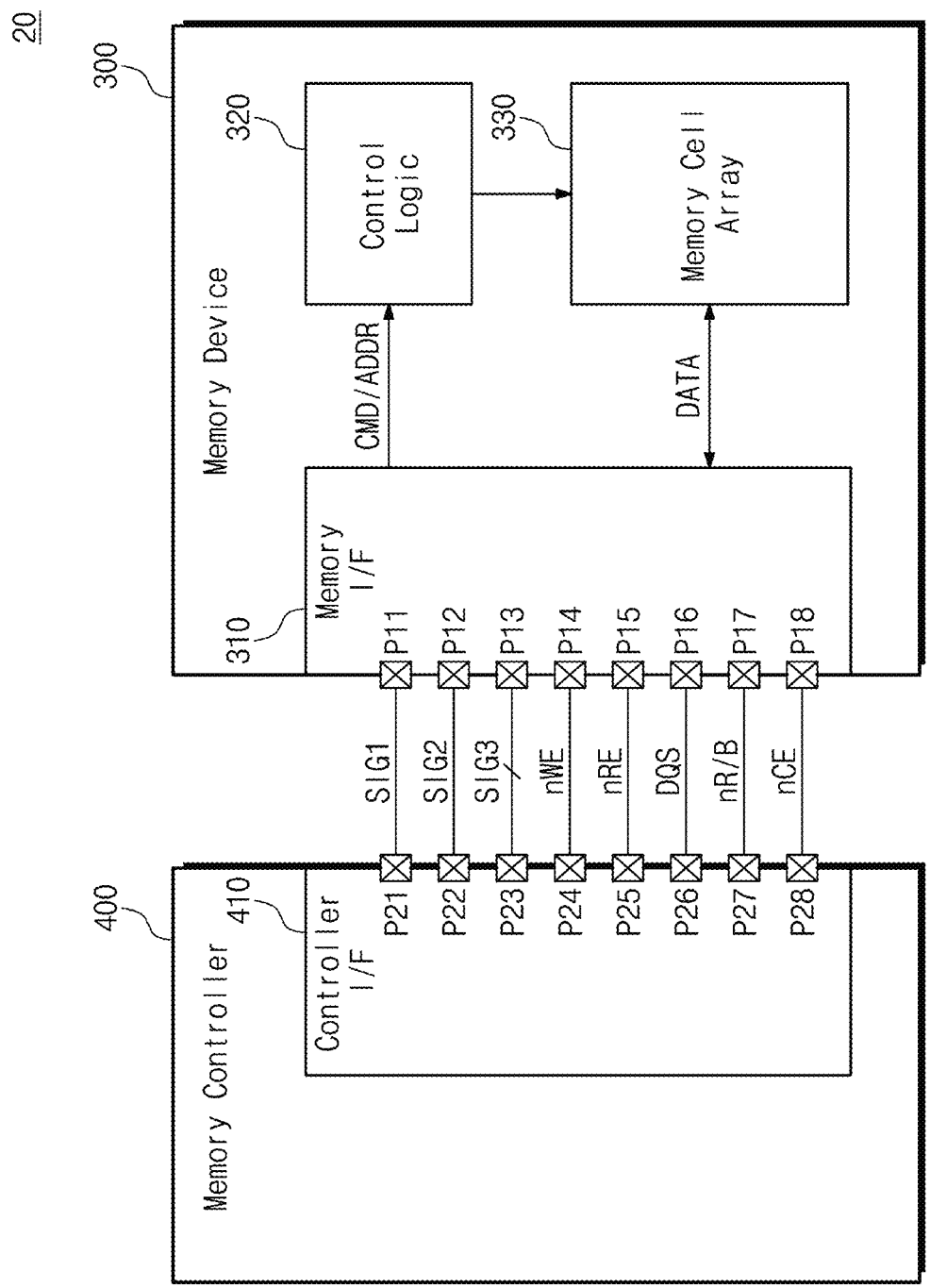
FIG. 11 is a block diagram illustrating an example of expansion of a memory system of FIG. 3.

FIG. 11 is a block diagram illustrating an example of expansion of a memory system of FIG. 3. Referring to FIG. 11, the memory device 300 may further include a fifth pin P15, a sixth pin P16, a seventh pin P17, and an eighth pin P18. The memory interface circuit 310 may receive a read enable signal nRE from the memory controller 400 through the fifth pin P15. For example, the read enable signal nRE may be a differential signal. Through the sixth pin P16, the memory interface circuit 310 may receive the data strobe signal DQS from the memory controller 400 or may transmit the data strobe signal DQS to the memory controller 400. For example, the data strobe signal DQS may be a differential signal. The memory interface circuit 310 may transmit a ready/busy output signal nR/B to the memory controller 400 through the seventh pin P17. The memory interface circuit 310 may receive a chip enable signal nCE from the memory controller 400 through the eighth pin P18.

The memory interface circuit 310 may exchange signals with the memory controller 400 through the first to seventh pins P11 to P17 according to the chip enable signal nCE. For example, in the case where the chip enable signal nCE is in an enable state (e.g., at the low level), the memory interface circuit 310 may exchange signals with the memory controller 400 through the first to seventh pins P11 to P17.

In a data output operation of the memory device 300, the memory interface circuit 310 may receive the read enable signal nRE toggling through the fifth pin P15 before outputting the data "DATA". The memory interface circuit 310 may generate the data strobe signal DQS toggling based on toggling of the read enable signal nRE. For example, the memory interface circuit 310 may generate the data strobe signal DQS that starts to toggle from a predetermined delay from a toggling start time of the read enable signal nRE. The memory interface circuit 310 may output the third signals SIG3 including the data "DATA" based on a toggle timing of the data strobe signal DQS. As such, the data "DATA" may be aligned with the toggle timing of the data strobe signal DQS and may be transmitted to the memory controller 400.

In a data input operation of the memory device 300, in the case where the third signals SIG3 including the data "DATA" are received from the memory controller 400, the memory interface circuit 310 may receive the toggling data strobe signal DQS from the memory controller 400 together with the data "DATA". The memory interface circuit 310 may obtain the data "DATA" from the third signals SIG3 based on the toggle timing of the data strobe signal DQS. For example, the memory interface circuit 310 may obtain the data "DATA" by sampling the third signals SIG3 at a rising edge and a falling edge of the data strobe signal DQS.

The memory interface circuit 310 may transmit the operation status information of the memory device 300 to the memory controller 400 through the ready/busy output signal nR/B. In the case where the memory device 300 is in a busy state (i.e., in the case where internal operations of the memory device 300 are being performed), the memory interface circuit 310 may transmit the ready/busy output signal nR/B indicating the busy state to the memory controller 400. In the case where the memory device 300 is in a ready state (i.e., in the case where internal operations of the memory device 300 are not performed or are completed), the memory interface circuit 310 may transmit the ready/busy output signal nR/B indicating the ready state to the memory controller 400. For example, while the memory device 300 reads the data "DATA" from the memory cell array 330 in response to a page read command, the memory interface circuit 310 may transmit the ready/busy output signal nR/B indicating the busy state (e.g., the low level) to the memory controller 400. For example, while the memory device 300 programs the data "DATA" to the memory cell array 330 in response to a program command, the memory interface circuit 310 may transmit the ready/busy output signal nR/B indicating the busy state to the memory controller 400.

The memory controller 400 may further include a fifth pin P25, a sixth pin P26, a seventh pin P27, and an eighth pin P28. The controller interface circuit 410 may transmit the read enable signal nRE to the memory device 300 through the fifth pin P25. Through the sixth pin P26, the controller interface circuit 410 may receive the data strobe signal DQS from the memory device 300 or may transmit the data strobe signal DQS to the memory device 300. The controller interface circuit 410 may receive the ready/busy output signal nR/B from the memory device 300 through the seventh pin P27. The controller interface circuit 410 may transmit the chip enable signal nCE to the memory device 300 through the eighth pin P28.

In the data output operation of the memory device 300, the controller interface circuit 410 may generate the read enable signal nRE toggling and may transmit the read enable signal nRE to the memory device 300. For example, the read enable signal nRE may maintain the static state (e.g., the high level or the low level) and may start to toggle before the data "DATA" are output. As such, the memory device 300 may generate the data strobe signal DQS toggling based on the read enable signal nRE. The controller interface circuit 410 may receive the third signals SIG3 including the data "DATA" from the memory device 300 together with the data strobe signal DQS toggling. The controller interface circuit 410 may obtain the data "DATA" from the third signals SIG3 based on the toggle timing of the data strobe signal DQS.

In the data input operation of the memory device 300, the controller interface circuit 410 may generate the data strobe signal DQS toggling. For example, the data strobe signal DQS may maintain the static state (e.g., the high level or the low level) and may start to toggle before the data "DATA" are transmitted. The controller interface circuit 410 may transmit the third signals SIG3 including the data "DATA" to the memory device 300 based on toggle timings of the data strobe signal DQS. For example, the data "DATA" may be transmitted in a state of being aligned with edge timings of the data strobe signal DQS.

Figure 12A:
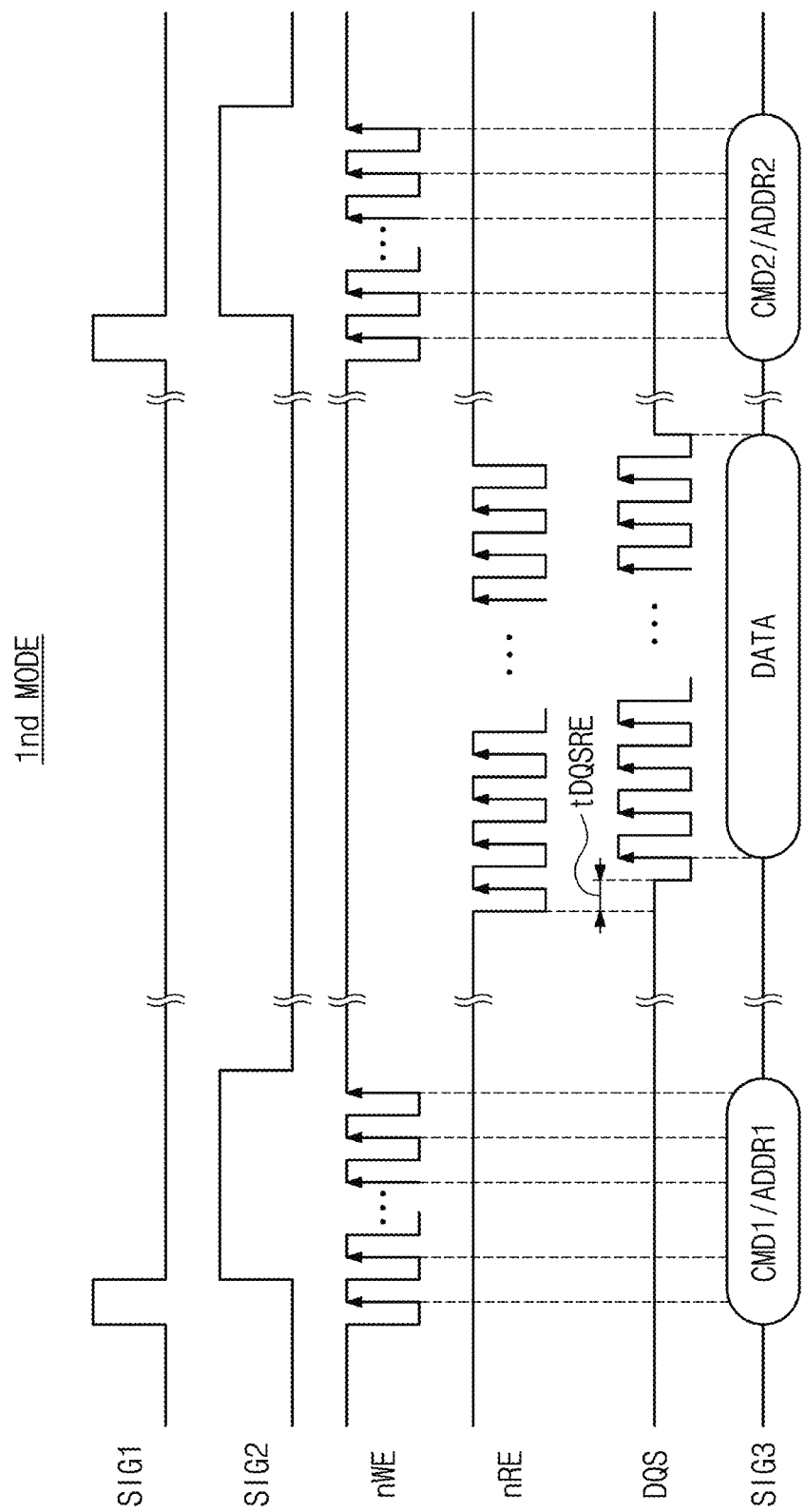
FIG. 12A is a timing diagram illustrating an example in which a memory device of FIG. 11 outputs data in the first mode.
Figure 12B:
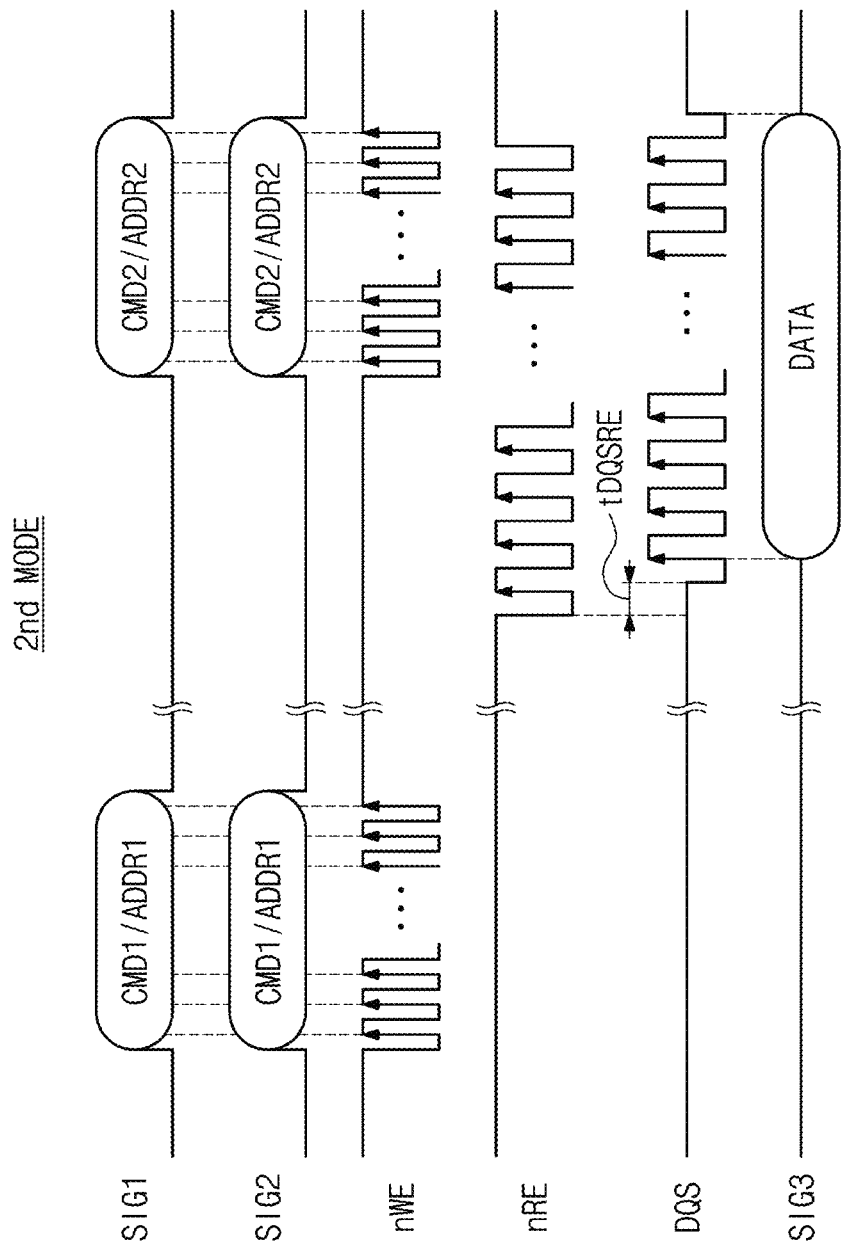
FIG. 12B is a timing diagram illustrating an example in which a memory device of FIG. 11 outputs data in the second mode.
Figure 12C:
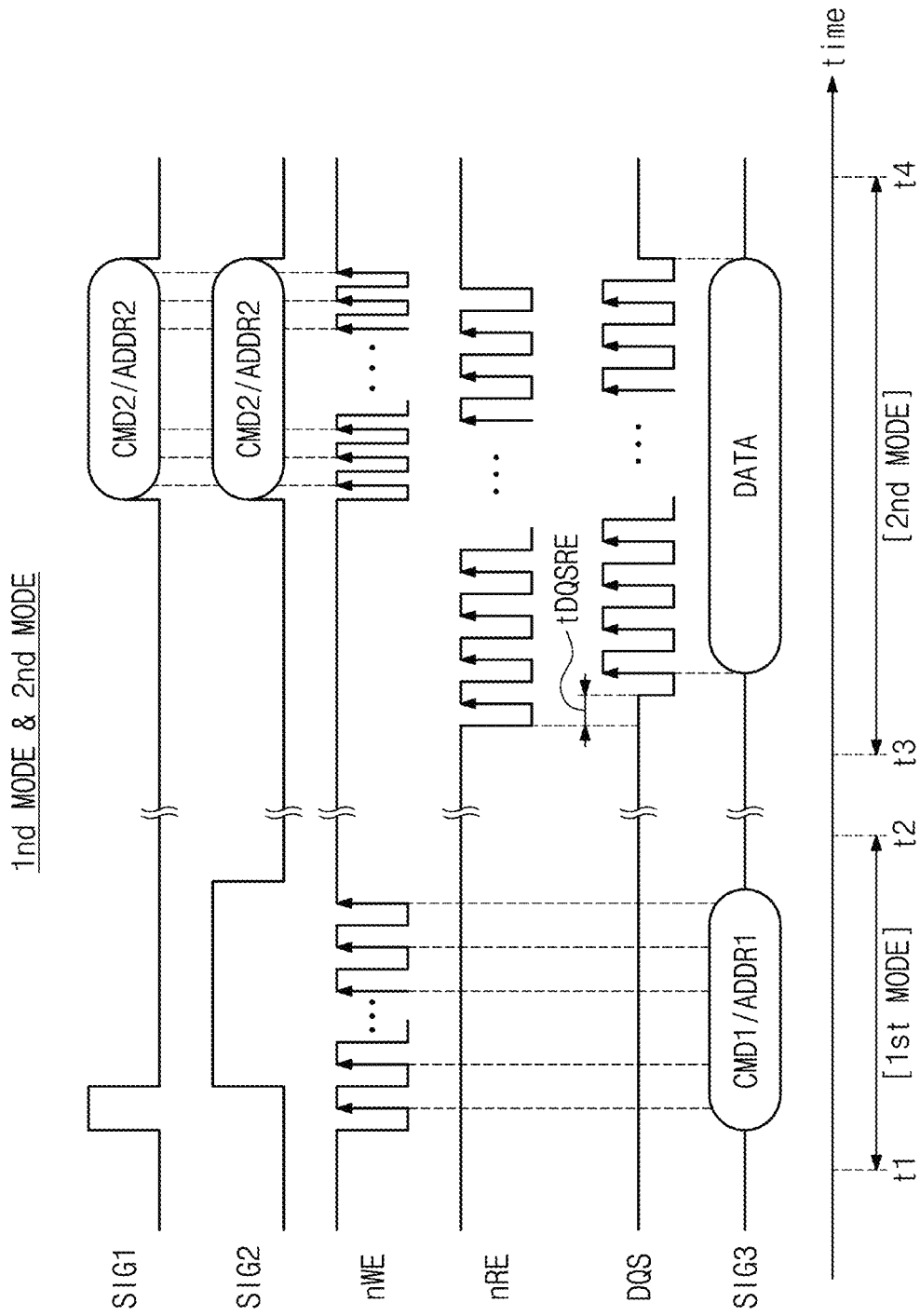
FIG. 12C is a timing diagram illustrating an example in which a memory device of FIG. 11 operates in the first mode and the second mode in a data output operation.

FIG. 12A is a timing diagram illustrating an example in which a memory device of FIG. 11 outputs data in the first mode. FIG. 12B is a timing diagram illustrating an example in which a memory device of FIG. 11 outputs data in the second mode. FIG. 12C is a timing diagram illustrating an example in which a memory device of FIG. 11 operates in the first mode and the second mode in a data output operation. In detail, FIGS. 12A to 12C show examples in which the memory device 300 outputs the data "DATA" according to a first command CMD1 and a first address ADDR1 and receives a second command CMD2 and a second address ADDR2. For example, the first command CMD1 may be a data output command, and the second command CMD2 may be a command identical to or different from the first command CMD1 in type.

Referring to FIG. 12A, in the first mode, the memory device 300 may receive the third signals SIG3 including the first command CMD1 and the first address ADDR1. The memory device 300 may obtain the first command CMD1 from the third signals SIG3 based on the write enable signal nWE toggling in an enable period (e.g., logical high) of the first signal SIG1 and may obtain the first address ADDR1 from the third signals SIG3 based on the write enable signal nWE toggling in an enable period (e.g., logical high) of the second signal SIG2. For example, in a period where the first command CMD1 and the first address ADDR1 are received, the read enable signal nRE may be at the high level, and the data strobe signal DQS may be in the "don't care" state (e.g., the high-z state).

The memory device 300 may receive the toggling read enable signal nRE from the memory controller 400 according to the first command CMD1. The memory device 300 may generate the data strobe signal DQS toggling according to toggling of the read enable signal nRE in response to the first command CMD1. In this case, the data strobe signal DQS may start to toggle after a predetermined time tDQSRE from a time when the read enable signal nRE starts to toggle. The memory device 300 may transmit the third signals SIG3 including the data "DATA" to the memory controller 400 together with the data strobe signal DQS. For example, in a period where the data "DATA" are transmitted, the first and second signals SIG1 and SIG2 may be at the low level, and the write enable signal nWE may be at the high level.

After transmitting the data "DATA", the memory device 300 may receive the third signals SIG3 including the second command CMD2 and the second address ADDR2. The memory device 300 may obtain the second command CMD2 from the third signals SIG3 based on the write enable signal nWE toggling in an enable period (e.g., logical high) of the first signal SIG1 and may obtain the second address ADDR2 from the third signals SIG3 based on the write enable signal nWE toggling in an enable period (e.g., logical high) of the second signal SIG2. For example, in a period where the second command CMD2 and the second address ADDR2 are received, the read enable signal nRE may be at the high level, and the data strobe signal DQS may be in the "don't care" state (e.g., the high-z state).

Referring to FIG. 12B, in the second mode, the memory device 300 may receive the first and second signals SIG1 and SIG2, including the first command CMD1 and the first address ADDR1, as described with reference to FIG. 5B. The memory device 300 may obtain the first command CMD1 and the first address ADDR1 from the first and second signals SIG1 and SIG2 based on the write enable signal nWE toggling. For example, in a period where the first command CMD1 and the first address ADDR1 are received, the read enable signal nRE may be at the high level, and the data strobe signal DQS and the third signals SIG3 may be in the "don't care" state (e.g., the high-z state).

The memory device 300 may receive the toggling read enable signal nRE from the memory controller 400 according to the first command CMD1. The memory device 300 may generate the data strobe signal DQS toggling according to toggling of the read enable signal nRE in response to the first command CMD1. In this case, the data strobe signal DQS may start to toggle after a predetermined time tDQSRE from a time when the read enable signal nRE starts to toggle. The memory device 300 may transmit the third signals SIG3 including the data "DATA" to the memory controller 400 together with the data strobe signal DQS. For example, a frequency of the write enable signal nWE may be greater than a frequency of the read enable signal nRE and the data strobe signal DQS.

While transmitting the data "DATA" to the memory controller 400, the memory device 300 may receive the first and second signals SIG1 and SIG2, including the second command CMD2 and the second address ADDR2 from the memory controller 400. The memory device 300 may obtain the second command CMD2 and the second address ADDR2 from the first and second signals SIG1 and SIG2 based on the write enable signal nWE toggling. Accordingly, the transmission of the data "DATA" and the reception of the second command CMD2 and the second address ADDR2 may be performed in parallel. As such, a period where the write enable signal nWE, the read enable signal nRE, and the data strobe signal DQS toggle at the same time may be present in the second mode.

Referring to FIG. 12C, the memory device 300 may operate in the first mode to obtain the first command CMD1 and the first address ADDR1 and may operate in the second mode to obtain the second command CMD2 and the second address ADDR2. In this case, a mode of the memory device 300 may be changed during operation, and may not be selected in advance.

In an exemplary embodiment, the memory device 300 may determine a mode based on a combination of the write enable signal nWE, the read enable signal nRE, and the data strobe signal DQS. The memory device 300 may generate the mode selection signal PM described with reference to FIG. 6, based on the determined mode. In the case where the toggling write enable signal nWE is received while the read enable signal nRE and the data strobe signal DQS maintaining the static state (e.g., the high level) are received, the memory device 300 may operate in the first mode. In the case where the toggling write enable signal nWE is received while the toggling data strobe signal DQS or the toggling read enable signal nRE is received, the memory device 300 may operate in the second mode. As such, the memory device 300 may operate in the first mode from a first time t1 to a second time t2 and may operate in the second mode from a third time t3 to a fourth time t4. In this case, a frequency of the write enable signal nWE received in the first mode may be smaller than a frequency of the write enable signal nWE received in the second mode.

Because the memory device 300 operates in the first mode from the first time t1 to the second time t2, as described with reference to FIG. 12A, the memory device 300 may obtain the first command CMD1 and the first address ADDR1 from the third signals SIG3. Because the memory device 300 operates in the second mode from the third time t3 to the fourth time t4, as described with reference to FIG. 12B, the memory device 300 may obtain the second command CMD2 and the second address ADDR2 from the first signal SIG1 and the second signal SIG2.

Figure 13:
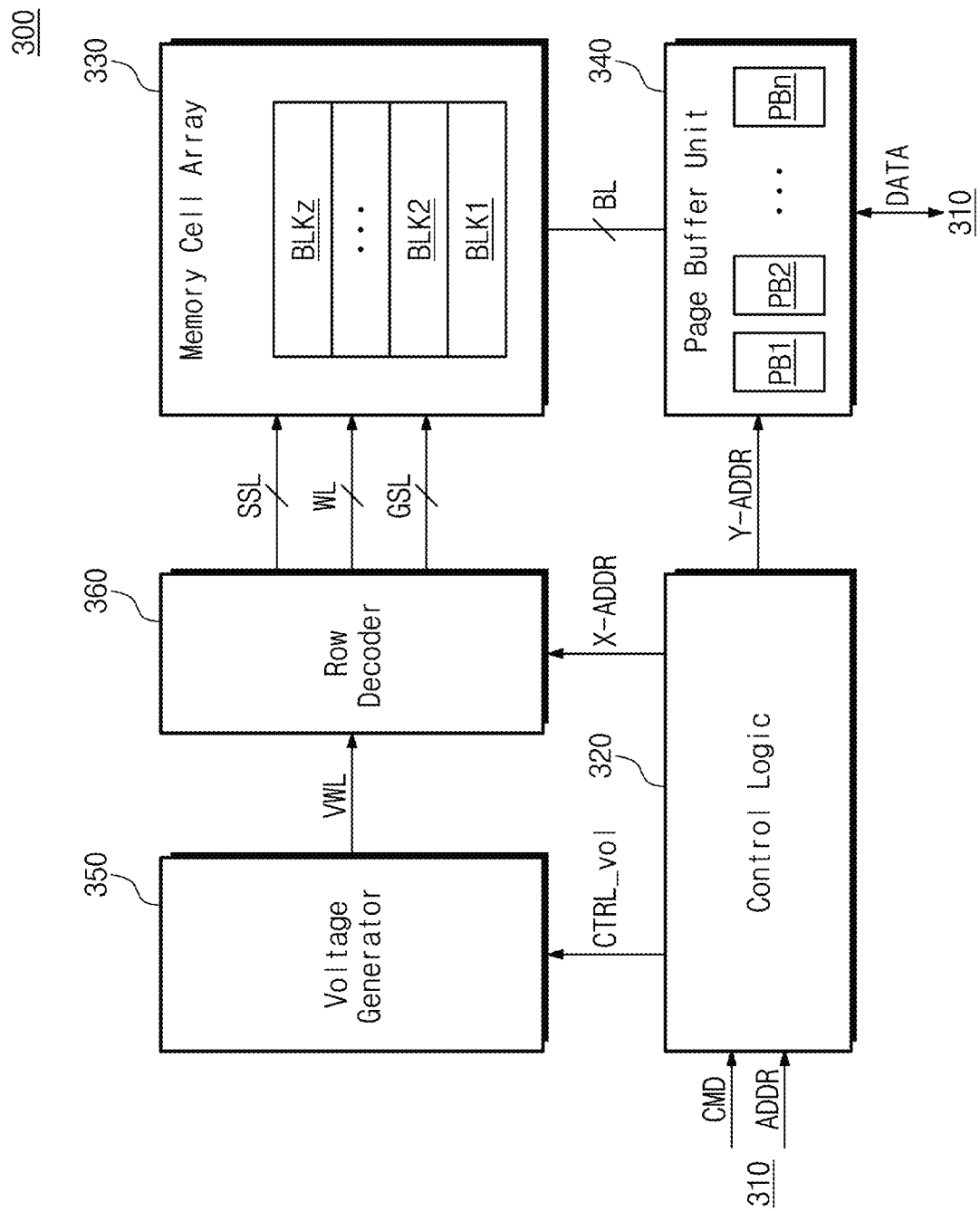
FIG. 13 is a block diagram illustrating a memory device of FIG. 3.

FIG. 13 is a block diagram illustrating a memory device of FIG. 3, according to one example embodiment. Referring to FIG. 13, the memory device 300 may include the control logic circuit 320, the memory cell array 330, a page buffer unit 340, a voltage generator 350, and a row decoder 360. Although not illustrated in FIG. 13, the memory device 300 may further include the memory interface circuit 310 illustrated in FIG. 3 and may further include column logic, a pre-decoder, a temperature sensor, a command decoder, an address decoder, and the like.

The control logic circuit 320 may control various kinds of operations of the memory device 300. The control logic circuit 320 may output various kinds of control signals in response to the command CMD and/or the address ADDR from the memory interface circuit 310. For example, the control logic circuit 320 may output a voltage control signal CTRL_vol, a row address X-ADDR, and a column address Y-ADDR.

In an exemplary embodiment, as described with reference to FIGS. 6 to 9, the control logic circuit 320 may receive the command CMD and the address ADDR through the command cycle signal CMD_C, the address cycle signal ADDR_C, and the command/address signals CA in the first mode and the second mode. For example, regardless of a mode, the control logic circuit 320 may receive the command CMD and the address ADDR in compliance with the same interface manner.

The memory cell array 330 may include a plurality of memory blocks BLK1 to BLKz (z being a positive integer), each of which includes a plurality of memory cells. The memory cell array 330 may be connected with the page buffer unit 340 through a plurality of bit lines BL and may be connected with the row decoder 360 through a plurality of word lines WL, a plurality of string selection lines SSL, and a plurality of ground selection lines GSL.

In an exemplary embodiment, the memory cell array 330 may include a three-dimensional memory cell array, which includes a plurality of NAND strings. Each NAND string may include memory cells respectively connected with word lines vertically stacked on a substrate. A memory cell array such as described in U.S. Pat. Nos. 7,679,133; 8,553,466; 8,654,587; 8,559,235; and US Pat. Pub. No. 2011/0233648, which describe three-dimensional memory cell arrays, may be used. These patents and patent publications are hereby incorporated by reference in their entirety. In an exemplary embodiment, the memory cell array 330 may include a two-dimensional memory cell array, which includes a plurality of NAND strings arranged along row and column directions.

The page buffer unit 340 may include a plurality of page buffers PB1 to PBn (n being an integer of 3 or more), and the plurality of page buffers PB1 to PBn may be respectively connected with memory cells through the plurality of bit lines BL. The page buffer unit 340 may select at least one of the bit lines BL based on the column address Y-ADDR. The page buffer unit 340 may operate as a write driver or a sense amplifier according to an operating mode. For example, in a program operation, the page buffer unit 340 may apply a bit line voltage corresponding to data to be programmed to the selected bit line. In a read operation, the page buffer unit 340 may sense a current or voltage of the selected bit line to sense data stored in a memory cell.

The voltage generator 350 may generate various kinds of voltages for performing the program, read, and erase operations based on the voltage control signal CTRL_vol. For example, the voltage generator 350 may generate a program voltage, a read voltage, a program verification voltage, an erase voltage, or the like as a word line voltage VWL.

In response to the row address X-ADDR, the row decoder 360 may select one of the plurality of word lines WL and may select one of the plurality of string selection lines SSL. For example, in the program operation, the row decoder 360 may apply the program voltage and the program verification voltage to the selected word line; in the read operation, the row decoder 360 may apply the read voltage to the selected word line.

Figure 14:
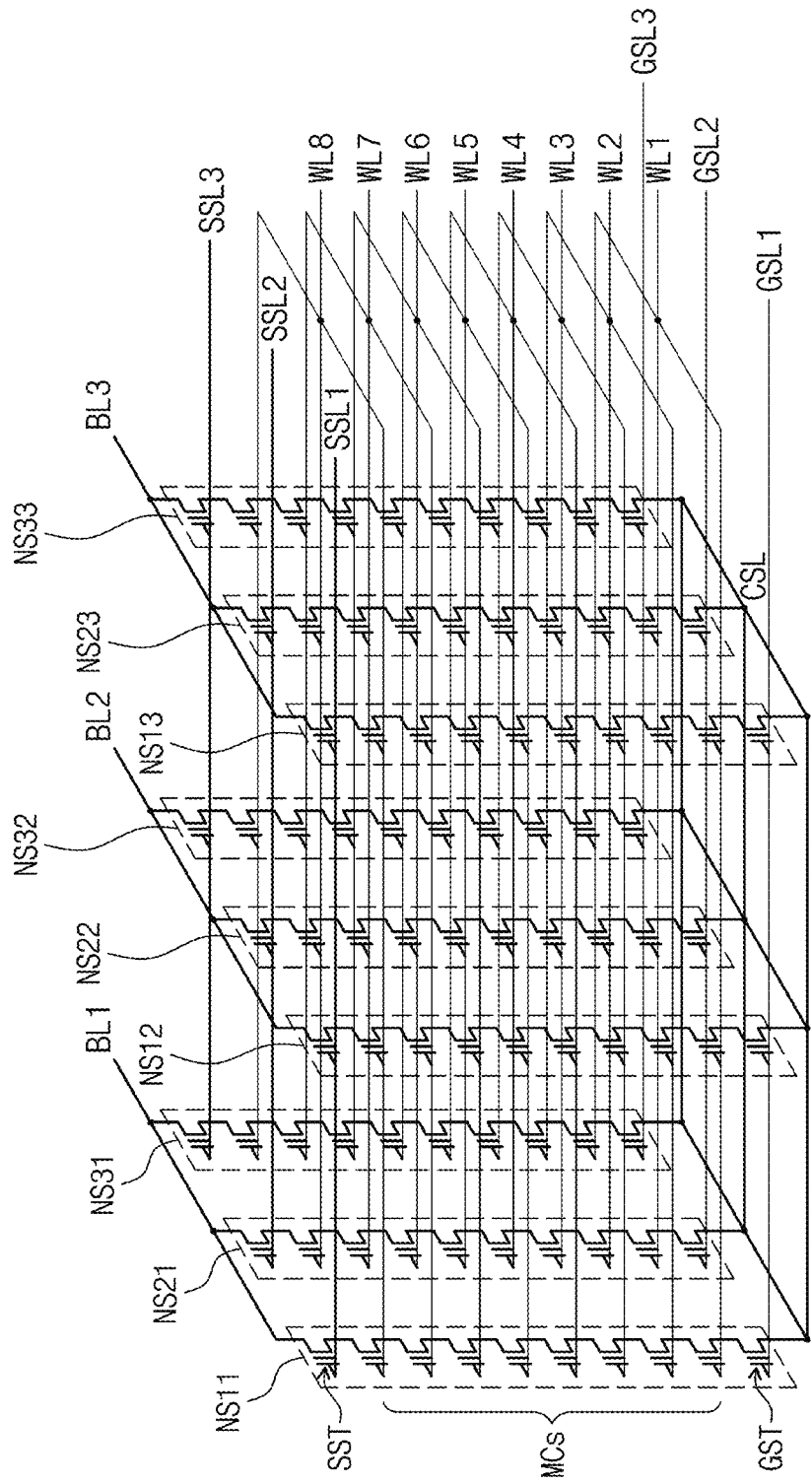
FIG. 14 is a circuit diagram illustrating a memory block according to an embodiment of the present disclosure.

FIG. 14 is a circuit diagram illustrating a memory block according to an embodiment of the present disclosure. Referring to FIG. 14, a memory block BLK may be one of the memory blocks BLK1 to BLKz of FIG. 13. The memory block BLK may include NAND strings NS11 to NS33, each (e.g., NS11) of which includes a string selection transistor SST, a plurality of memory cells MCs, and a ground selection transistor GST connected in series.

The NAND strings NS11, NS21, and NS31 may be provided between a first bit line BL1 and a common source line CSL, the NAND strings NS12, NS22, and NS32 may be provided between a second bit line BL2 and the common source line CSL, and the NAND strings NS13, NS23, and NS33 may be provided between a third bit line BL3 and the common source line CSL. In each NAND string, the string selection transistor SST may be connected to one of string selection lines SSL1, SSL2, and SSL3. The memory cells MCs may be respectively connected with corresponding word lines WL1 to WL8. The ground selection transistor GST may be connected with one of ground selection lines GSL1, GSL2, and GSL3. In each NAND string, the string selection transistor SST may be connected with one of the bit lines BL1, BL2, and BL3, and the ground selection transistor GST may be connected with the common source line CSL. Here, the number of NAND strings, the number of word lines, the number of bit lines, the number of ground selection lines, and the number of string selection lines may be variously modified according to embodiments.

Figure 15A:
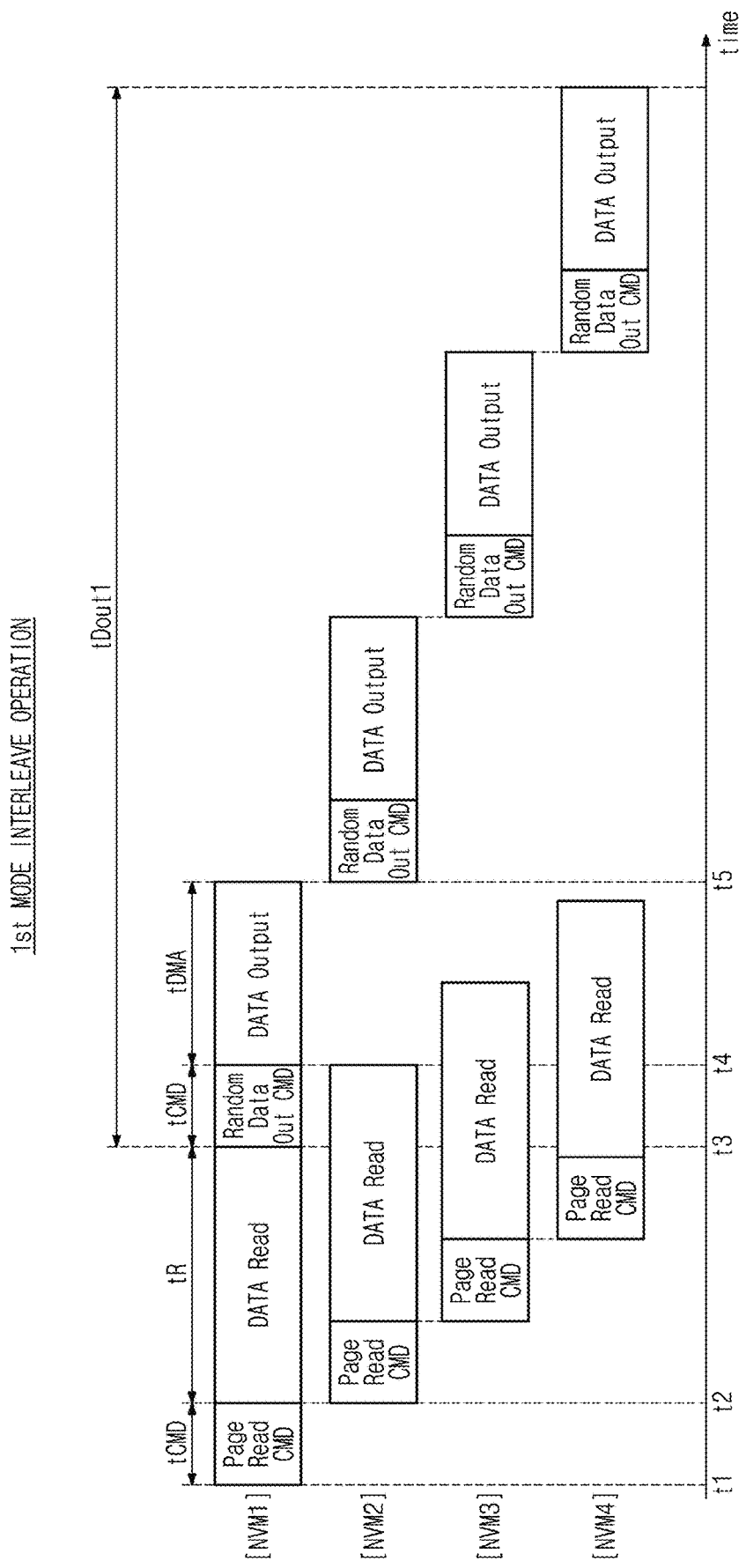
FIG. 15A illustrates an example of an interleave operation of a memory device in the first mode, according to an embodiment of the present disclosure.
Figure 15B:
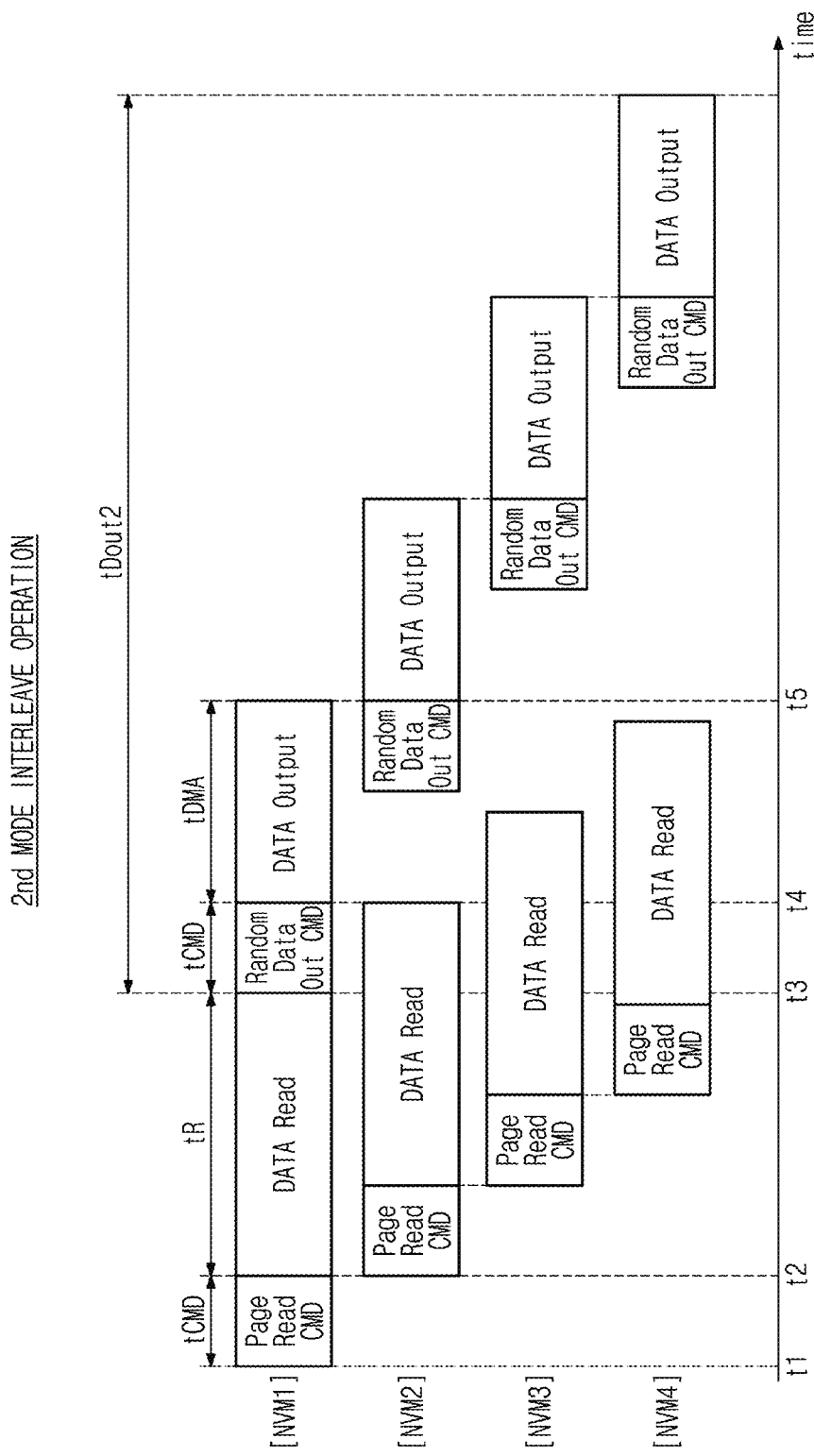
FIG. 15B illustrates an example of an interleave operation of a memory device in the second mode, according to an embodiment of the present disclosure.

FIG. 15A illustrates an example of an interleave operation of a memory device in the first mode, according to an embodiment of the present disclosure. FIG. 15B illustrates an example of an interleave operation of a memory device in the second mode, according to an embodiment of the present disclosure. In FIGS. 15A and 15B, as described with reference to FIG. 1, an interleave operation will be described with reference to a plurality of nonvolatile memory devices NVM1 to NVM4 connected with one channel, but the number of nonvolatile memory devices may be variously modified.

Referring to FIGS. 15A and 15B, each of the nonvolatile memory devices NVM1 to NVM4 may receive a page read command CMD from the memory controller 200 (refer to FIG. 1) during a command transmission time tCMD and may read the data "DATA" from the memory cell array 330 (refer to FIG. 3) during a data read time tR in response to the page read command CMD. The command transmission time tCMD and data read time tR may also be referred to as time periods or time durations. The first nonvolatile memory device NVM1 may receive the page read command CMD from a first time t1 and may read the data "DATA" from a second time t2 in response to the page read command CMD.

Because an operation of reading the data "DATA" from the memory cell array 330 is performed in each of the nonvolatile memory devices NVM1 to NVM4, while one nonvolatile memory device performs the read operation, another nonvolatile memory device may receive the page read command CMD through a common channel. For example, while the first nonvolatile memory device NVM1 performs the read operation, the second nonvolatile memory device NVM2 may receive the page read command CMD from the second time t2. As such, four page read commands CMD for the nonvolatile memory devices NVM1 to NVM4 may be provided continuously without a time interval for waiting for data to be read.

After the data read operation is completed, each of the nonvolatile memory devices NVM1 to NVM4 may receive a random data out command CMD from the memory controller 200 during the command transmission time tCMD and may output the read data "DATA" during a data out time tDMA in response to the random data out command CMD. For example, the first nonvolatile memory device NVM1 may receive the random data out command CMD from a third time t3 and may output the read data "DATA" from a fourth time t4 in response to the random data out command CMD. As such, the data "DATA" may be sequentially output from the nonvolatile memory devices NVM1 to NVM4.

Referring to FIG. 15A, in the first mode, each of the nonvolatile memory devices NVM1 to NVM4 may receive the random data out command CMD through the third pins P13 and may output the data "DATA" through the third pins P13, as described with reference to FIG. 3. Because the nonvolatile memory devices NVM1 to NVM4 share one channel (i.e., share the third pins P13), it is impossible to transmit the random data out command CMD to another nonvolatile memory device while the data "DATA" are output from one nonvolatile memory device. As such, after the data "DATA" are output from one nonvolatile memory device, the random data out command CMD may be transmitted to another nonvolatile memory device. For example, after the data "DATA" are output from the first nonvolatile memory device NVM1 from a fourth time t4 to a fifth time t5, the random data out command CMD may be transmitted to the second nonvolatile memory device NVM2 from the fifth time t5. Likewise, the third nonvolatile memory device NVM3 may receive the random data out command CMD after the data output operation of the second nonvolatile memory device NVM2 is completed, and the fourth nonvolatile memory device NVM4 may receive the random data out command CMD after the data output operation of the third nonvolatile memory device NVM3 is completed. Accordingly, a total time tDout1 when the data "DATA" are output from the first to fourth nonvolatile memory devices NVM1 to NVM4 through the above interleave operation may be a sum of four command transmission times tCMD and four data output times tDMA.

Referring to FIG. 15B, in the second mode, each of the nonvolatile memory devices NVM1 to NVM4 may receive the random data out command CMD through the first and second pins P11 and P12 and may output the data "DATA" through the third pins P13, as described with reference to FIG. 3. In this case, an operation in which data "DATA" are output from one nonvolatile memory device and an operation in which another nonvolatile memory device receives the random data out command CMD may be performed in parallel. As such, while the data "DATA" are output from one nonvolatile memory device, the random data out command CMD may be transmitted to another nonvolatile memory device. For example, the random data out command CMD may be transmitted to the second nonvolatile memory device NVM2 while the data "DATA" are output from the first nonvolatile memory device NVM1, for example, during a time interval from the fourth time t4 to the fifth time t5. Likewise, the third nonvolatile memory device NVM3 may receive the random data out command CMD while the data output operation of the second nonvolatile memory device NVM2 is performed, and the fourth nonvolatile memory device NVM4 may receive the random data out command CMD while the data output operation of the third nonvolatile memory device NVM3 is performed. Accordingly, a total time tDout2 when the data "DATA" are output from the first to fourth nonvolatile memory devices NVM1 to NVM4 through the above interleave operation may be a sum of one command transmission time tCMD and four data output times tDMA.

To provide the random data out command CMD to each of the nonvolatile memory devices NVM1 to NVM4 in the second mode, each of the nonvolatile memory devices NVM1 to NVM4 may provide a memory controller with status information indicating whether an internal read operation is completed. As described with reference to FIG. 11, each of the nonvolatile memory devices NVM1 to NVM4 may provide status information through the ready/busy output signal nR/B. Alternatively, as described with reference to FIG. 6, in response to the status read command of the memory controller, each of the nonvolatile memory devices NVM1 to NVM4 may provide status information through any other pin (e.g., the first pin P11 or the second pin P12 of FIG. 5) except for pins of transferring the data "DATA". As such, while the data "DATA" are output from one nonvolatile memory device, status information of another nonvolatile memory device may be checked.

As described above, the total time tDout2 when the data "DATA" are output from a plurality of nonvolatile memory devices NVM1 to NVM4 connected with one channel through the interleave operation in the second mode may be smaller than the total time tDout1 when the data "DATA" are output from the plurality of nonvolatile memory devices NVM1 to NVM4 connected with the channel through the interleave operation in the first mode. Likewise, according to embodiments of the present disclosure, a total time necessary for the memory controller to receive the data "DATA" from a plurality of nonvolatile memory devices connected with one channel through the interleave operation in the second mode may be smaller than a total time necessary for the memory controller to receive the data "DATA" from the plurality of nonvolatile memory devices connected with the channel through the interleave operation in the first mode. Accordingly, in the second mode, a speed at which the data "DATA" are input/output may be improved.

Below, various examples of a memory system supporting the second mode will be described with reference to FIGS. 16 to 21.

Figure 16:
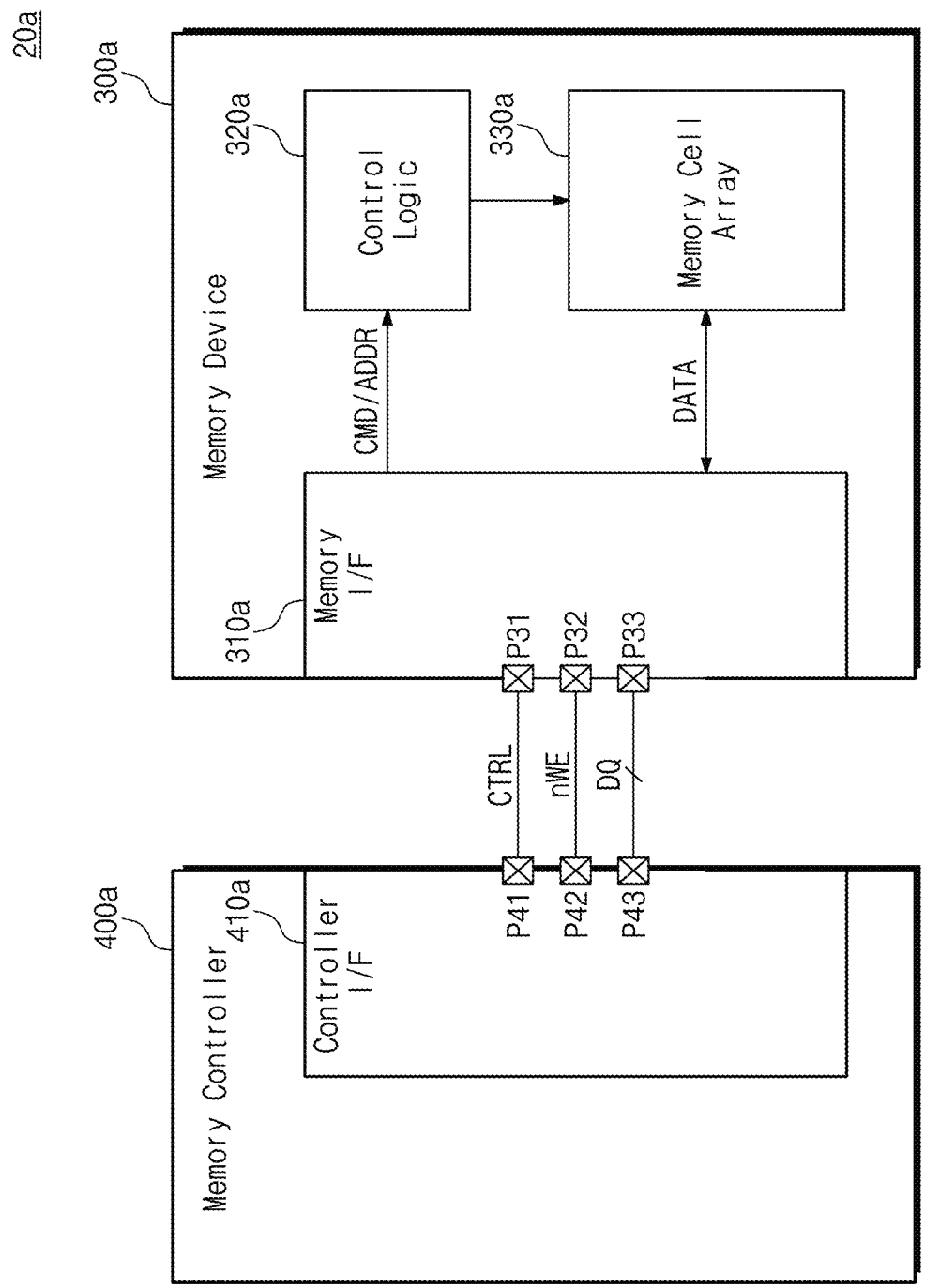
FIG. 16 is a block diagram illustrating a memory system supporting the second mode, according to an embodiment of the present disclosure.

FIG. 16 is a block diagram illustrating a memory system supporting the second mode, according to an embodiment of the present disclosure. Referring to FIG. 16, a memory system 20a may include a memory device 300a and a memory controller 400a. The memory device 300a may include a first pin P31, a second pin P32, third pins P33, a memory interface circuit 310a, a control logic circuit 320a, and a memory cell array 330a, and the memory controller 400a may include a first pin P41, a second pin P42, third pins P43, and a controller interface circuit 410a. The memory interface circuit 310a, the control logic circuit 320a, and the memory cell array 330a may respectively correspond to the memory interface circuit 310, the control logic circuit 320, and the memory cell array 330 of FIG. 3, and the controller interface circuit 410a may correspond to the controller interface circuit 410 of FIG. 3.

The memory interface circuit 310a may receive a control signal CTRL including the command/address CMD/ADDR from the memory controller 400a through the first pin P31. The memory interface circuit 310a may receive the write enable signal nWE from the memory controller 400a through the second pin P32. Through the third pins P33, the memory interface circuit 310a may receive data signals DQ including the data "DATA" from the memory controller 400a or may transmit the data signals DQ to the memory controller 400a. For example, the first pin P31 may be a pin (e.g., the first pin P11 or the second pin P12 of FIG. 3) for receiving the command latch enable signal CLE or the address latch enable signal ALE in the first mode, but the present disclosure is not limited thereto.

The memory interface circuit 310a may obtain the command/address CMD/ADDR from the control signal CTRL based on toggle timings of the write enable signal nWE. In an exemplary embodiment, the memory interface circuit 310a may obtain the command CMD through the control signal CTRL based on a state of the control signal CTRL at a first toggle timing and may obtain the address ADDR through the control signal CTRL based on a state of the control signal CTRL at a second toggle timing.

The controller interface circuit 410a may transmit the control signal CTRL including the command/address CMD/ADDR to the memory device 300a through the first pin P41. The controller interface circuit 410a may transmit the write enable signal nWE to the memory device 300a through the second pin P42. Through the third pins P43, the controller interface circuit 410a may transmit the data signals DQ including the data "DATA" to the memory device 300a or may receive the data signals DQ from the memory device 300a.

Figure 17:
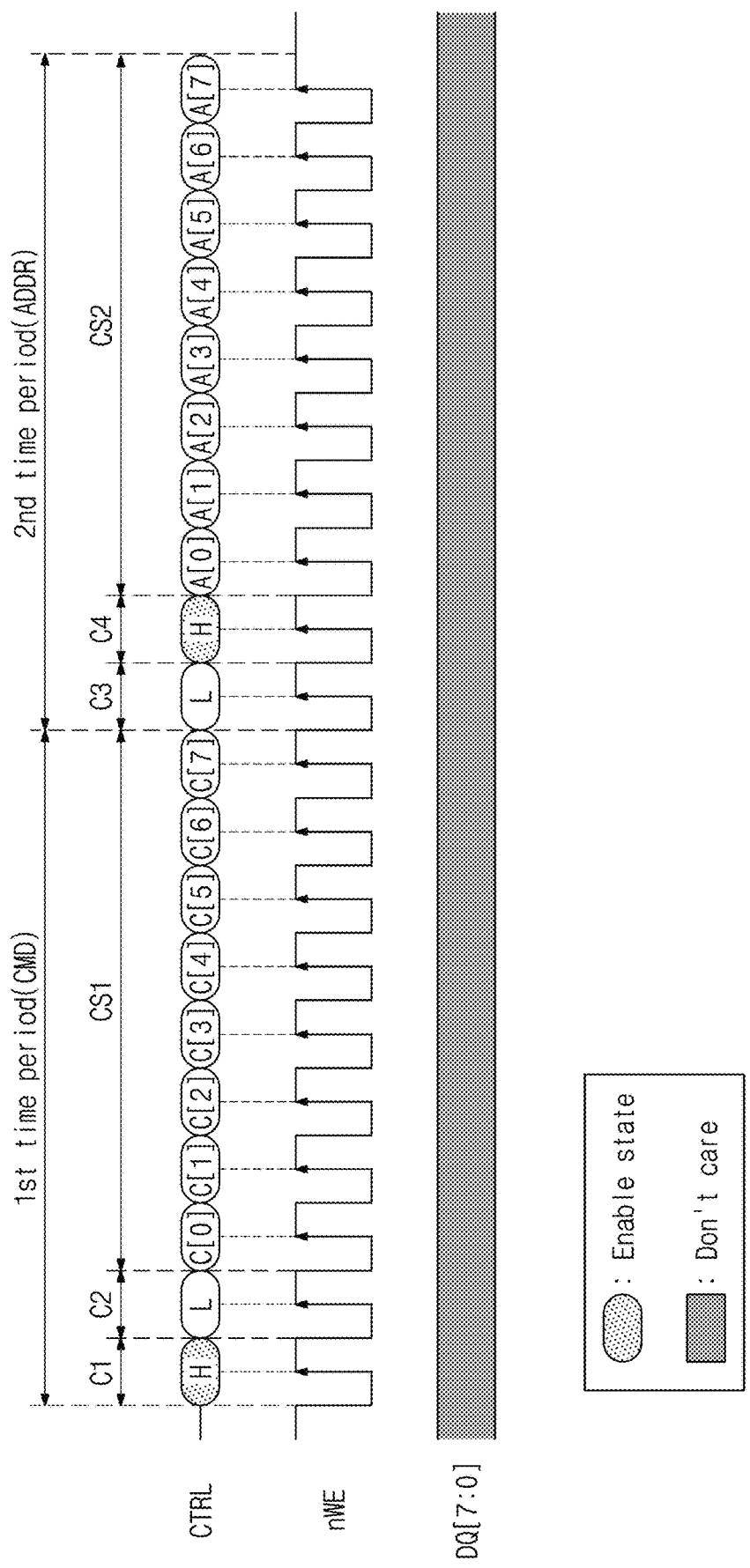
FIG. 17 is a timing diagram illustrating an example in which a memory device of FIG. 16 receives a command and an address.

FIG. 17 is a timing diagram illustrating an example in which a memory device of FIG. 16 receives a command and an address. Referring to FIGS. 16 and 17, the memory device 300a may receive the control signal CTRL including the command CMD and the address ADDR from the memory controller 400a. While the control signal CTRL including the command CMD and the address ADDR is received, the write enable signal nWE may be in a toggling state, and the data signals DQ[7:0] may be don't care signals. The memory device 300a may receive the command CMD during a first time period and may receive the address ADDR during a second time period. Each of the first and second time periods may include cycle periods corresponding to 10 cycles of the write enable signal nWE.

In the case where the control signal CTRL received during a first cycle period C1 of the first time period is in an enable state (e.g., at the high level), the memory device 300a may obtain the command CMD from the control signal CTRL received during the remaining cycle periods CS1 (after the second cycle period C2) of the first time period. In this case, the control signal CTRL received during a second cycle period C2 of the first time period may be in a disable state (e.g., the low level). The memory device 300a may obtain the command CMD from signal values C[0] to C[7] of the control signal CTRL sampled at rising edges of the write enable signal nWE during the remaining cycle periods CS1.

In the case where the control signal CTRL received during a second cycle period C4 of the second time period is in an enable state (e.g., at the high level), the memory device 300a may obtain the address ADDR from the control signal CTRL received during the remaining cycle periods CS2 of the second time period. In this case, the control signal CTRL received during a first cycle period C3 of the second time period may be in a disable state (e.g., the low level). The memory device 300a may obtain the address ADDR from signal values A[0] to A[7] of the control signal CTRL sampled at rising edges of the write enable signal nWE during the remaining cycle periods CS2. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). In some circumstances and contexts, such as when describing an nth cycle period of a time period, the "n" may indicate an order/position in which the nth cycle period occurs with respect to other cycle periods of a time period. Specific examples are described further below.

Figure 18:
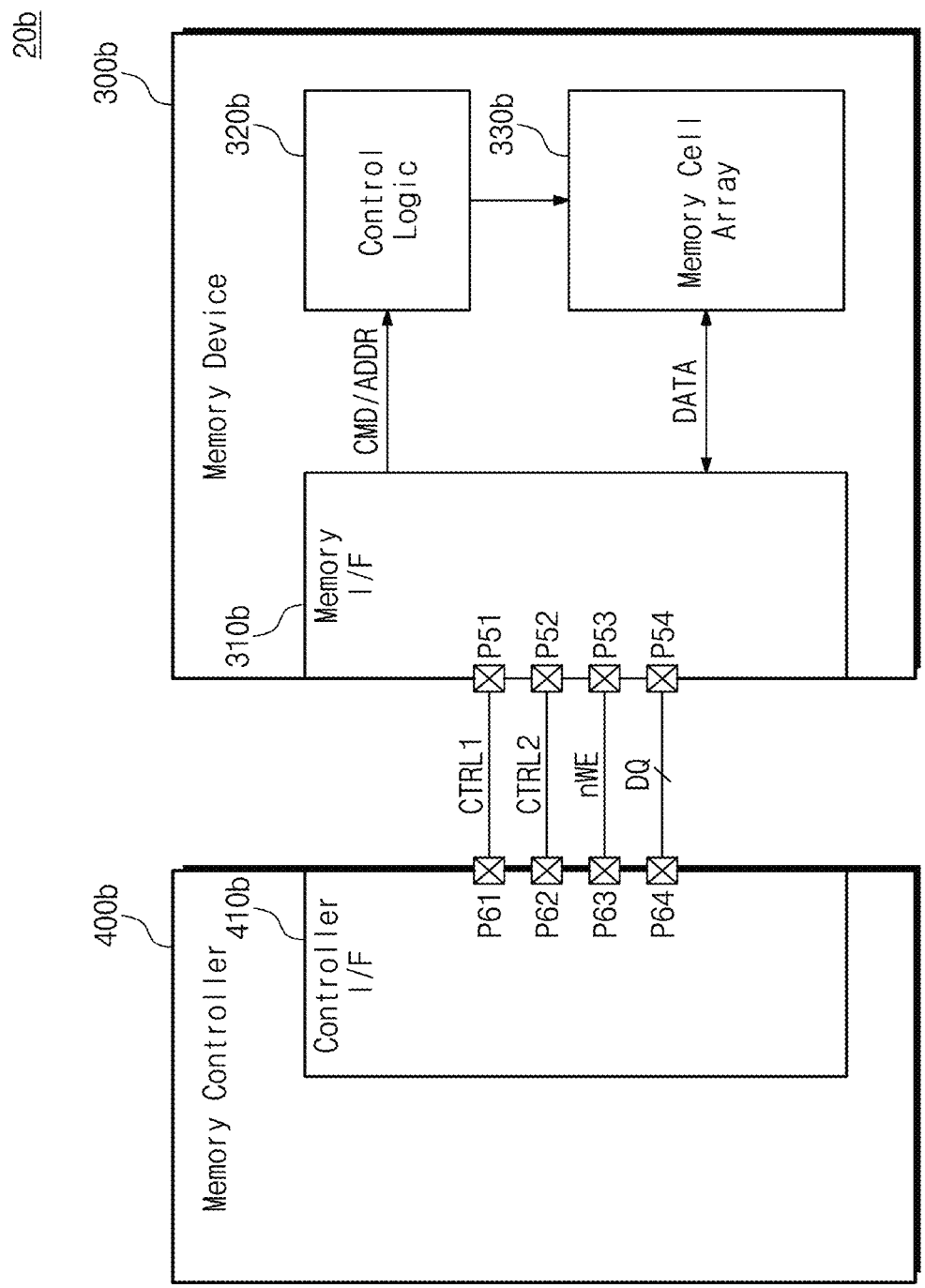
FIG. 18 is a block diagram illustrating a memory system supporting the second mode, according to an embodiment of the present disclosure.

FIG. 18 is a block diagram illustrating a memory system supporting the second mode, according to an embodiment of the present disclosure. Referring to FIG. 18, a memory system 20b may include a memory device 300b and a memory controller 400b. The memory device 300b may include a first pin P51, a second pin P52, a third pin P53, fourth pins P54, a memory interface circuit 310b, a control logic circuit 320b, and a memory cell array 330b, and the memory controller 400b may include a first pin P61, a second pin P62, a third pin P63, fourth pins P64, and a controller interface circuit 410b. The memory interface circuit 310b, the control logic circuit 320b, and the memory cell array 330b may respectively correspond to the memory interface circuit 310, the control logic circuit 320, and the memory cell array 330 of FIG. 3, and the controller interface circuit 410b may correspond to the controller interface circuit 410 of FIG. 3.

The memory interface circuit 310b may receive a first control signal CTRL1 and a second control signal CTRL2, which include the command/address CMD/ADDR, from the memory controller 400b through the first pin P51 and the second pin P52. The memory interface circuit 310b may receive the write enable signal nWE from the memory controller 400b through the third pin P53. Through the fourth pins P54, the memory interface circuit 310b may receive the data signals DQ including the data "DATA" from the memory controller 400b or may transmit the data signals DQ to the memory controller 400b. For example, the first pin P51 may be a pin (e.g., the first pin P11 of FIG. 3) for receiving the command latch enable signal CLE in the first mode, and the second pin P52 may be a pin (e.g., the second pin P12 of FIG. 3) for receiving the address latch enable signal ALE in the first mode. However, the present disclosure is not limited thereto.

The memory interface circuit 310b may obtain the command/address CMD/ADDR from the first and second control signals CTRL1 and CTRL2 based on toggle timings of the write enable signal nWE. In an exemplary embodiment, the memory interface circuit 310b may obtain the command CMD through the control signals CTRL1 and CTRL2 based on a state of the first control signal CTRL1 at a specific toggle timing and may obtain the address ADDR through the control signals CTRL1 and CTRL2 based on a state of the second control signal CTRL2 at a specific toggle timing.

The controller interface circuit 410b may transmit the first control signal CTRL1 and the second control signal CTRL2, which include the command/address CMD/ADDR, to the memory device 300b through the first pin P61 and the second pin P62. The controller interface circuit 410b may transmit the write enable signal nWE to the memory device 300a through the third pin P63. Through the fourth pins P64, the controller interface circuit 410b may transmit the data signals DQ including the data "DATA" to the memory device 300b or may receive the data signals DQ from the memory device 300b.

Figure 19:
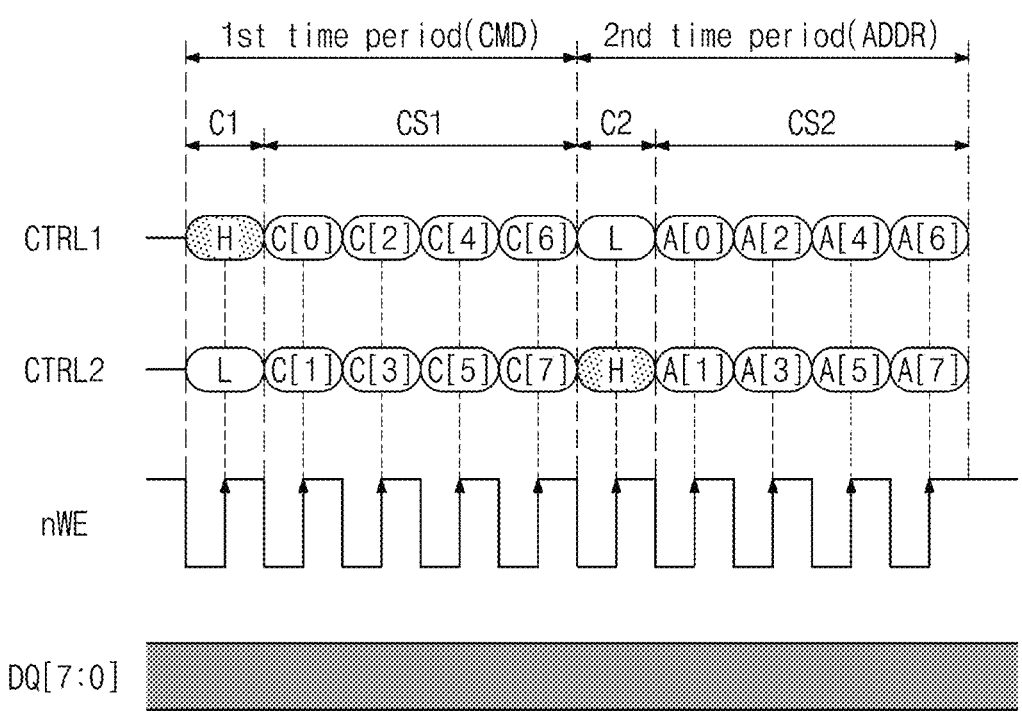
FIG. 19 is a timing diagram illustrating an example in which a memory device of FIG. 18 receives a command and an address.

FIG. 19 is a timing diagram illustrating an example in which a memory device of FIG. 18 receives a command and an address. Referring to FIGS. 18 and 19, the memory device 300b may receive the first and second control signals CTRL1 and CTRL2, including the command CMD and the address ADDR from the memory controller 400b. While the first and second control signals CTRL1 and CTRL2, including the command CMD and the address ADDR are received, the write enable signal nWE may be in a toggling state, and the data signals DQ[7:0] may be don't care. The memory device 300b may receive the command CMD during a first time period and may receive the address ADDR during a second time period. Each of the first and second time periods may include cycle periods corresponding to 5 cycles of the write enable signal nWE.

In the case where the first control signal CTRL1 received during a first cycle period C1 of the first time period is in an enable state (e.g., at the high level), the memory device 300b may obtain the command CMD from the control signals CTRL1 and CTRL2 received during the remaining cycle periods CS1 of the first time period. In this case, the second control signal CTRL2 received during the first cycle period C1 may be in a disable state (e.g., the low level "L"). The memory device 300b may obtain the command CMD from signal values C[0] to C[7] of the control signals CTRL1 and CTRL2 sampled at rising edges of the write enable signal nWE during the remaining cycle periods CS1.

In the case where the second control signal CTRL2 received during a second cycle period C2 of the second time period is in an enable state (e.g., at the high level), the memory device 300b may obtain the address ADDR from the control signals CTRL1 and CTRL2 received during the remaining cycle periods CS2 of the second time period. In this case, the first control signal CTRL1 received during a second cycle period C2 of the second time period may be in a disable state (e.g., the low level). The memory device 300b may obtain the address ADDR from signal values A[0] to A[7] of the control signals CTRL1 and CTRL2 sampled at rising edges of the write enable signal nWE during the remaining cycle periods CS2.

Figure 20:
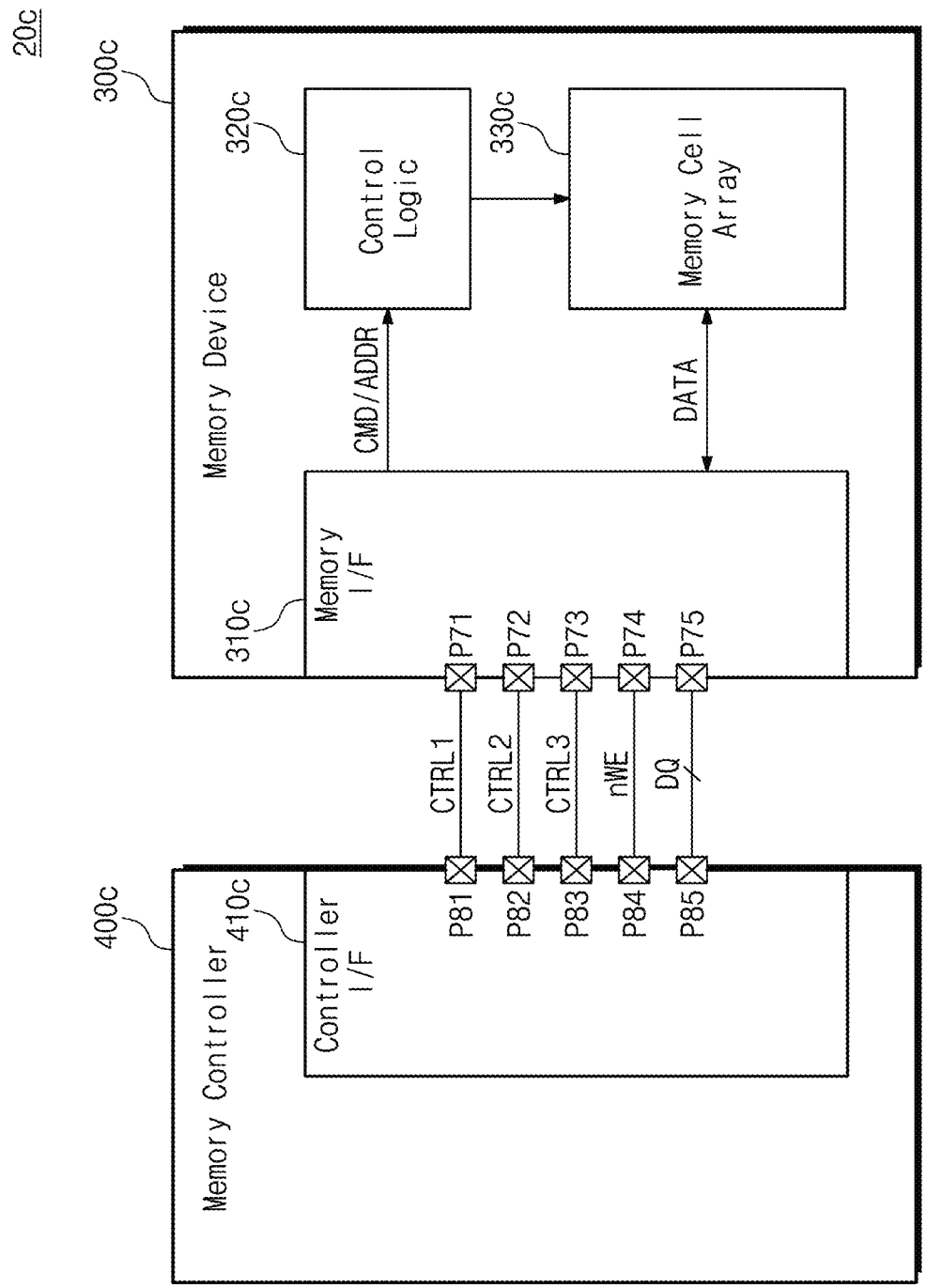
FIG. 20 is a block diagram illustrating a memory system supporting the second mode, according to an embodiment of the present disclosure.

FIG. 20 is a block diagram illustrating a memory system supporting the second mode, according to an embodiment of the present disclosure. Referring to FIG. 20, a memory system 20c may include a memory device 300c and a memory controller 400c. The memory device 300c may include a first pin P71, a second pin P72, a third pin P74, a fourth pin P74, fifth pins P75, a memory interface circuit 310c, a control logic circuit 320c, and a memory cell array 330c, and the memory controller 400c may include a first pin P81, a second pin P82, a third pin P83, a fourth pin P84, fifth pins P85, and a controller interface circuit 410c. The memory interface circuit 310c, the control logic circuit 320c, and the memory cell array 330c may respectively correspond to the memory interface circuit 310, the control logic circuit 320, and the memory cell array 330 of FIG. 3, and the controller interface circuit 410c may correspond to the controller interface circuit 410 of FIG. 3.

The memory interface circuit 310c may receive a first control signal CTRL1, a second control signal CTRL2, and a third control signal CTRL3, which include the command/address CMD/ADDR, from the memory controller 400c through the first to third pins P71 to P73. The memory interface circuit 310c may receive the write enable signal nWE from the memory controller 400c through the fourth pin P74. Through the fifth pins P75, the memory interface circuit 310c may receive the data signals DQ including the data "DATA" from the memory controller 400c or may transmit the data signals DQ to the memory controller 400c. For example, the first pin P71 may be a pin (e.g., the first pin P11 of FIG. 3) for receiving the command latch enable signal CLE in the first mode, and the second pin P72 may be a pin (e.g., the second pin P12 of FIG. 3) for receiving the address latch enable signal ALE in the first mode. However, the present disclosure is not limited thereto.

The memory interface circuit 310c may obtain the command/address CMD/ADDR from the first to third control signals CTRL1 to CTRL3 based on toggle timings of the write enable signal nWE. In an exemplary embodiment, the memory interface circuit 310c may obtain the command CMD through the control signals CTRL1 to CTRL3 based on a state of the first control signal CTRL1 at a specific toggle timing and may obtain the address ADDR through the control signals CTRL1 to CTRL3 based on a state of the second control signal CTRL2 at a specific toggle timing. In this case, at the specific toggle timing, one of bit values of the command CMD or the address ADDR may be transmitted through the third control signal CTRL3, or an invalid value may be transmitted through the third control signal CTRL3.

The controller interface circuit 410c may transmit the first to third control signals CTRL1 to CTRL3 including the command/address CMD/ADDR to the memory device 300c through the first pin P81, the second pin P82, and the third pin P83. The controller interface circuit 410c may transmit the write enable signal nWE to the memory device 300c through the fourth pin P84. Through the fifth pins P85, the controller interface circuit 410c may transmit the data signals DQ including the data "DATA" to the memory device 300c or may receive the data signals DQ from the memory device 300c.

Figure 21:
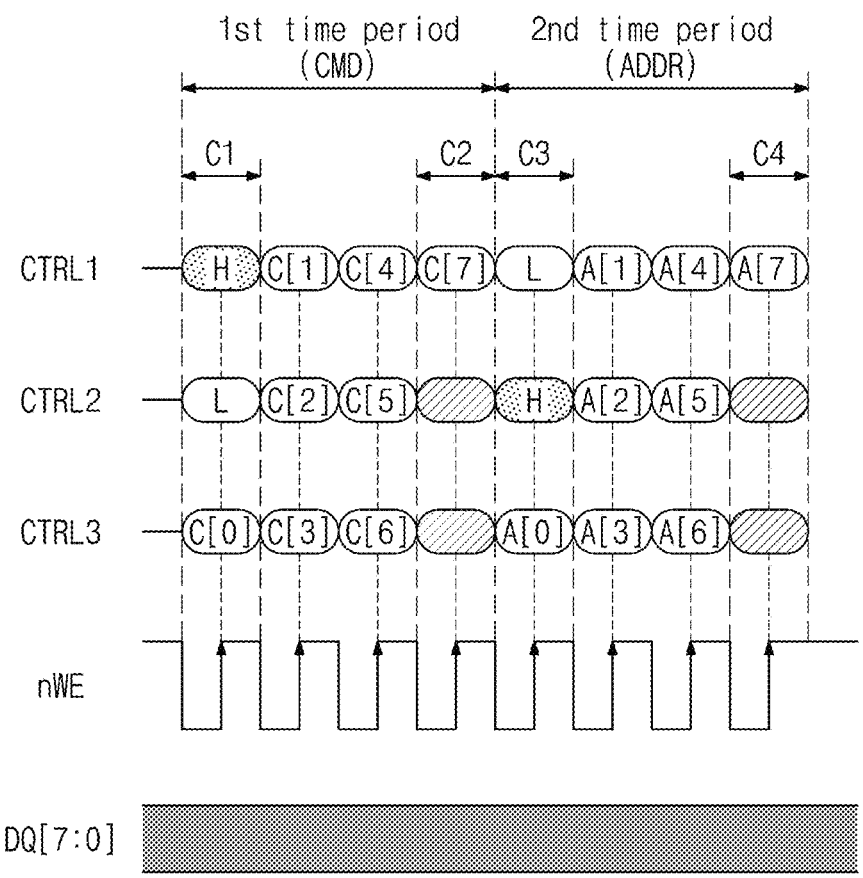
FIG. 21 is a timing diagram illustrating an example in which a memory device of FIG. 20 receives a command and an address.

FIG. 21 is a timing diagram illustrating an example in which a memory device of FIG. 20 receives a command and an address. Referring to FIGS. 20 and 21, the memory device 300c may receive the first to third control signals CTRL1 to CTRL3, including the command CMD and the address ADDR from the memory controller 400c. While the first to third control signals CTRL1 to CTRL3, including the command CMD and the address ADDR are received, the write enable signal nWE may be in a toggling state, and the data signals DQ[7:0] may be don't care signals. The memory device 300c may receive the command CMD during a first time period and may receive the address ADDR during a second time period. Each of the first and second time periods may include cycle periods corresponding to 4 cycles of the write enable signal nWE.

In the case where the first control signal CTRL1 received during a first cycle period C1 of the first time period is in an enable state (e.g., at the high level), the memory device 300c may obtain the command CMD from the control signals CTRL1 to CTRL3 received during the remaining cycle periods CS1 of the first time period. In this case, the second control signal CTRL2 received during the first cycle period C1 may be in a disable state (e.g., the low level "L"), and the third control signal CTRL3 may include one bit value C[0] of bit values C[0] to C[7] of the command CMD. The memory device 300c may obtain the command CMD from signal values C[0] to C[7] of the control signals CTRL1 to CTRL3 sampled at rising edges of the write enable signal nWE during the first time period.

In the case where the bit values C[0] to C[7] of the command CMD are received through the control signals CTRL1 to CTRL3 in the first time period, at least one of the control signals CTRL1 to CTRL3 may include an invalid value in the first time period. The invalid value may be one of the low level, the high level, and the high-z state. For example, as illustrated in FIG. 21, the second control signal CTRL2 and the third control signal CTRL3 may include an invalid value in a second cycle period C2 of the first time period.

In the case where the second control signal CTRL2 received during a first cycle period C3 of the second time period is in an enable state (e.g., at the high level), the memory device 300c may obtain the address ADDR from the control signals CTRL1 to CTRL3 received during the second time period. In this case, the first control signal CTRL1 received during the first cycle period C3 may be in a disable state (e.g., the low level "L"), and the third control signal CTRL3 may include one bit value A[0] of bit values A[0] to A[7] of the address ADDR. The memory device 300c may obtain the address ADDR from signal values A[0] to A[7] of the control signals CTRL1 to CTRL3 sampled at rising edges of the write enable signal nWE during the second time period.

In the case where the bit values A[0] to A[7] of the address ADDR are received through the control signals CTRL1 to CTRL3 in the second time period, at least one of the control signals CTRL1 to CTRL3 may include an invalid value in the second time period. For example, as illustrated in FIG. 21, the second control signal CTRL2 and the third control signal CTRL3 may include an invalid value in a fourth cycle period C4 of the second time period.

A cycle period for determining the command CMD or the address ADDR is illustrated in FIGS. 17, 19, and 21 as the first cycle period or the second cycle period of all the cycle periods of the predetermined time period, but the present disclosure is not limited thereto. For example, a cycle period for determining the command CMD or the address ADDR may be variously selected from all the cycle periods of the predetermined time period. For example, a cycle period may be described as a "specific cycle period," during which a determination of whether a command CMD or address ADDR is selected is made. The specific cycle period, without further identification, can be any one cycle period of the predetermined time period. Two specific cycle periods may be described as a first specific cycle period and a second specific cycle period, without the labels "first" or "second" necessarily denoting the temporal location of the named specific cycle period within the predetermined time period. To denote a temporal location, a phrase such as "first-occurring cycle period," or "second-occurring cycle period," etc., may be used. Also, to indicate two cycle periods of different predetermined time periods that have the same relative time-location in both predetermined time periods, the two cycle periods may be described as having the same relative time-location in both predetermined time periods. Or, for two cycle periods of different predetermined time periods that have different relative time-locations in each predetermined time period, they may be described as having different relative time-locations in each predetermined time period.

Examples are illustrated in FIGS. 19 and 21 as the command CMD and the address ADDR are determined through different control signals CTRL1 and CTRL2, but the present disclosure is not limited thereto. For example, the command CMD and the address ADDR may be determined through one of a plurality of control signals. In this case, as described with reference to FIG. 17, there may be received a control value for determining the command CMD during a first cycle period of all the cycle periods of the predetermined time period through one control signal, and there may be received a control value for determining the address ADDR during a second cycle period thereof.

As described above, according to embodiments of the present disclosure, each of the memory devices 300*a*, 300*b*, and 300*c* supporting the second mode may include one or more pins for the purpose of receiving one or more control signals including the command/address CMD/ADDR. In this case, as described with reference to FIGS. 16 to 21, the number of cycles of the predetermined time period may vary according to the number of pins for receiving the command/address CMD/ADDR. For example, an interface protocol for receiving the command/address CMD/ADDR may change.

Figure 22:
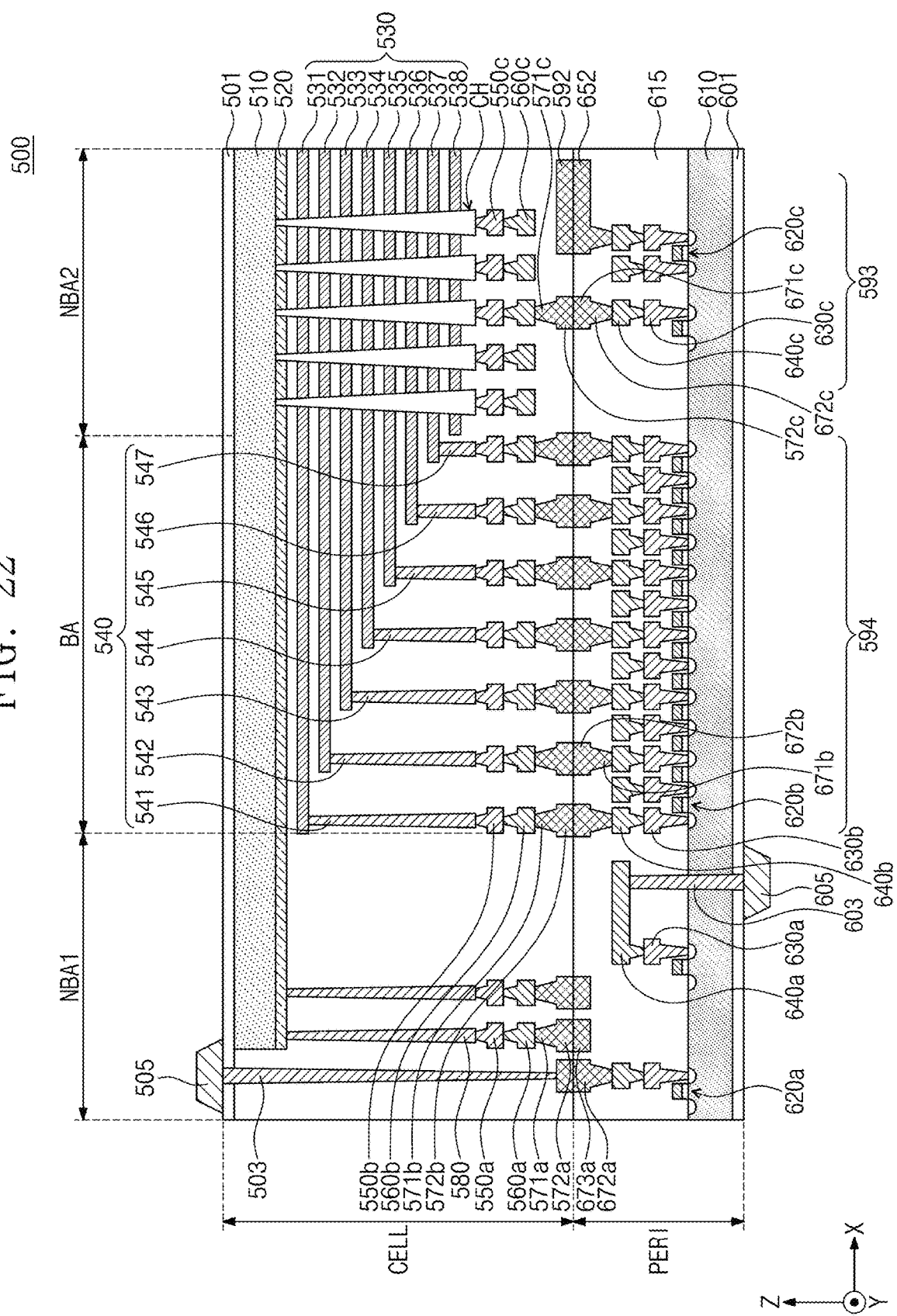
FIG. 22 is an exemplary cross-sectional view of a memory device according to an embodiment of the present disclosure.

FIG. 22 is an exemplary cross-sectional view of a memory device according to an embodiment of the present disclosure. Referring to FIG. 22, a memory device 500 may include a peripheral circuit region PERI and a cell region CELL disposed on the peripheral circuit region PERI. Each of the peripheral circuit region PERI and the cell region CELL may include a first non-bonding area NBA1, a bonding area BA, and a second non-bonding area NBA2.

The peripheral circuit region PERI may include a first substrate 610, an interlayer insulating layer 615, a plurality of circuit elements 620*a*, 620*b*, and 620*c* formed at the first substrate 610, first metal layers 630*a*, 630*b*, and 630*c* respectively connected with the plurality of circuit elements 620*a*, 620*b*, and 620*c*, and second metal layers 640*a*, 640*b*, and 640*c* formed on the first metal layers 630*a*, 630*b*, and 630*c*. In an example embodiment, the first metal layers 630*a*, 630*b*, and 630*c* may be formed of tungsten having relatively high resistance, and the second metal layers 640*a*, 640*b*, and 640*c* may be formed of copper having relatively low resistance.

In the specification, only the first metal layers 630*a*, 630*b*, and 630*c* and the second metal layers 640*a*, 640*b*, and 640*c* are illustrated, but the present disclosure is not limited thereto. For example, at least one or more metal layers may be further formed on the second metal layers 640*a*, 640*b*, and 640*c*. At least a part of the one or more metal layers formed on the second metal layers 640*a*, 640*b*, and 640*c* may be formed of aluminum or the like having a lower resistance than that of copper forming the second metal layers 640*a*, 640*b*, and 640*c*.

The interlayer insulating layer 615 may be disposed on the first substrate 610 to cover the plurality of circuit elements 620*a*, 620*b*, and 620*c*, the first metal layers 630*a*, 630*b*, and 630*c*, and the second metal layers 640*a*, 640*b*, and 640*c* and may include an insulating material such as silicon oxide or silicon nitride.

Lower bonding metals 671*b* and 672*b* may be formed on the second metal layer 640*b* of the bonding area BA. In the bonding area BA, the lower bonding metals 671*b* and 672*b* of the peripheral circuit region PERI may be electrically connected with upper bonding metals 571*b* and 572*b* of the cell region CELL by a Cu—Cu bonding manner.

The cell region CELL may provide at least one memory block. The cell region CELL may include a second substrate 510 and a common source line 520. On the second substrate 510, a plurality of word lines 531 to 538 (i.e., 530) may be stacked in a direction (a Z-axis direction) perpendicular to an upper surface of the second substrate 510. String selection lines and a ground selection line may be arranged on and below the plurality of word lines 530, respectively, and the plurality of word lines 530 may be interposed between the string selection line and the ground select line.

In the second non-bonding area NBA2, a channel structure CH may extend in the direction perpendicular to the upper surface of the second substrate 510 and may penetrate the word lines 530, the string selection lines, and the ground selection line. The channel structure CH may include a data storage layer, a channel layer, a buried insulating layer, and the like, and the channel layer may be electrically connected with a first metal layer 550*c* and a second metal layer 560*c*. For example, the first metal layer 550*c* may be a bit line contact, and the second metal layer 560*c* may be a bit line. In an exemplary embodiment, the second metal layer 560*c* may extend in a first direction (i.e., a Y-axis direction) parallel to the upper surface of the second substrate 510.

In the embodiment illustrated in FIG. 22, a region where the channel structure CH, the second metal layer 560*c*, and the like are disposed may be defined as the second non-bonding area NBA2. In the second non-bonding area NBA2, the second metal layer 560*c* may be electrically connected with circuit elements 620*c* providing a page buffer 593 in the peripheral circuit region PERI. For example, the second metal layer 560*c* may be connected with upper bonding metals 571*c* and 572*c* in the peripheral circuit region PERI, and the upper bonding metals 571*c* and 572*c* may be connected with lower bonding metals 671*c* and 672*c* connected with the circuit elements 620*c* of the page buffer 593.

In the bonding area BA, the word lines 530 may extend in a second direction (i.e., an X-axis direction) parallel to the upper surface of the second substrate 510 and may be connected with a plurality of cell contact plugs 541 to 547 (e.g., 540). The word lines 530 and the cell contact plugs 540 may be connected to each other at pads that are provided by at least a part of the word lines 530 extending in the second direction and having different lengths. A first metal layer 550*b* and a second metal layer 560*b* may be sequentially connected on the cell contact plugs 540 connected with the word lines 530. In the bonding area BA, the cell contact plugs 540 may be connected with the peripheral circuit region PERI through the upper bonding metals 571*b* and 572*b* of the cell region CELL and the lower bonding metals 671*b* and 672*b* of the peripheral circuit region PERI.

The cell contact plugs 540 may be electrically connected with circuit elements 620*b* providing a row decoder 594 in the peripheral circuit region PERI. In an exemplary embodiment, an operating voltage of the circuit elements 620*b* providing the row decoder 594 may be different from an operating voltage of the circuit elements 620*c* providing the page buffer 593. For example, the operating voltage of the circuit elements 620c providing the page buffer 593 may be greater than the operating voltage of the circuit elements 620b providing the row decoder 594.

A common source line contact plug 580 may be disposed in the first non-bonding area NBA1. The common source line contact plug 580 may be formed of a conductive material such as a metal, a metal compound, polysilicon, or the like and may be electrically connected with the common source line 520. A first metal layer 550a and a second metal layer 560a may be sequentially stacked on the common source line contact plug 580. For example, a region where the common source line contact plug 580, the first metal layer 550a, and the second metal layer 560a are arranged may be defined as the first non-bonding area NBA1.

Input/output pads 505 and 605 may be disposed in the first non-bonding area NBA1. Referring to FIG. 22, a lower insulating layer 601 covering a lower surface of the first substrate 610 may be formed on a lower surface of the first substrate 610, and the first input/output pad 605 may be formed on the lower insulating layer 601. The first input/output pad 605 may be connected with at least one of the plurality of circuit elements 620a, 620b, and 620c arranged in the peripheral circuit region PERI through a first input/output contact plug 603 and may be separated from the first substrate 610 by the lower insulating layer 601. Also, a side insulating layer may be interposed between the first input/output contact plug 603 and the first substrate 610 to electrically separate the first input/output contact plug 603 and the first substrate 610.

Referring to FIG. 22, an upper insulating layer 501 covering an upper surface of the second substrate 510 may be formed on an upper surface of the second substrate 510, and the second input/output pad 505 may be formed on the upper insulating layer 501. The second input/output pad 505 may be connected with at least one of the plurality of circuit elements 620a, 620b, and 620c arranged in the peripheral circuit region PERI through a second input/output contact plug 503.

According to embodiments, the second substrate 510, the common source line 520, and the like may not be arranged in a region where the second input/output contact plug 503 is disposed. Also, the second input/output pad 505 may not overlap the word lines 530 in a third direction (e.g., a Z-axis direction). Referring to FIG. 22, the second input/output contact plug 503 may be separated from the second substrate 510 in the direction parallel to the upper surface of the second substrate 510 and may be connected with the second input/output pad 505 through the upper insulating layer 501 of the cell region CELL.

According to embodiments, the first input/output pad 605 and the second input/output pad 505 may be selectively formed. For example, the memory device 500 may include only the first input/output pad 605 disposed on the lower surface of the first substrate 610 or may include only the second input/output pad 505 disposed on the upper surface of the second substrate 510. Alternatively, the memory device 500 may include both the first input/output pad 605 and the second input/output pad 505.

As a dummy pattern, a metal pattern of an uppermost metal layer may be present in each of the first non-bonding area NBA1 and the second non-bonding area NBA2 included in each of the cell region CELL and the peripheral circuit region PERI, or the uppermost metal layer may be absent.

In the first non-bonding area NBA1, the memory device 500 may include a lower metal pattern 673a, which corresponds to an upper metal pattern 572a formed in an uppermost metal layer of the cell region CELL and has the same shape as the upper metal pattern 572a of the cell region CELL, in the uppermost metal layer of the peripheral circuit region PERI. In the peripheral circuit region PERI, the lower metal pattern 673a formed in the uppermost metal layer of the peripheral circuit region PERI may not be connected with a separate contact. As in the above description, in the first non-bonding area NBA1, an upper metal pattern 571a that corresponds to a lower metal pattern 672a formed in an uppermost metal layer of the peripheral circuit region PERI and has the same shape as the lower metal pattern 672a of the peripheral circuit region PERI may be formed in an uppermost metal layer of the cell region CELL.

In the second non-bonding area NBA2, an upper metal pattern 592 that corresponds to a lower metal pattern 652 formed in an uppermost metal layer of the peripheral circuit region PERI and has the same shape as the lower metal pattern 652 of the peripheral circuit region PERI may be formed in an uppermost metal layer of the cell region CELL. A contact may not be formed on the upper metal pattern 592 formed in the uppermost metal layer of the cell region CELL.

According to an embodiment of the present disclosure, a reinforcement metal pattern that corresponds to a metal pattern formed in an uppermost metal layer in one of the cell region CELL and the peripheral circuit region PERI and has the same shape as the metal pattern may be formed in an uppermost metal layer in the other of the cell region CELL and the peripheral circuit region PERI, and a contact may not be formed on the reinforcement metal pattern.

In an exemplary embodiment, the first input/output pad 605 or the second input/output pad 505 may be connected with one of pins for receiving a data signal, which are described with reference to FIGS. 1 to 21. As such, a data signal may be received through the first input/output pad 605 or the second input/output pad 505. In this case, in the first mode, the command/address CMD/ADDR may be further received through the first input/output pad 605 or the second input/output pad 505. Though not shown, there may be a plurality of first input/output pads 605, or a plurality of second input/output pads 505 through which the data signal and command/address CMD/ADDR is received. In the second mode, the command/address CMD/ADDR may be received through at least another pad.

In another embodiment, the first input/output pad 605 or the second input/output pad 505 may be connected with one of pins for receiving a control signal including the command/address CMD/ADDR in the second mode described with reference to FIGS. 1 to 21. In this case, in the second mode, the command/address CMD/ADDR may be received through the first input/output pad 605 or the second input/output pad 505.

Figure 23:
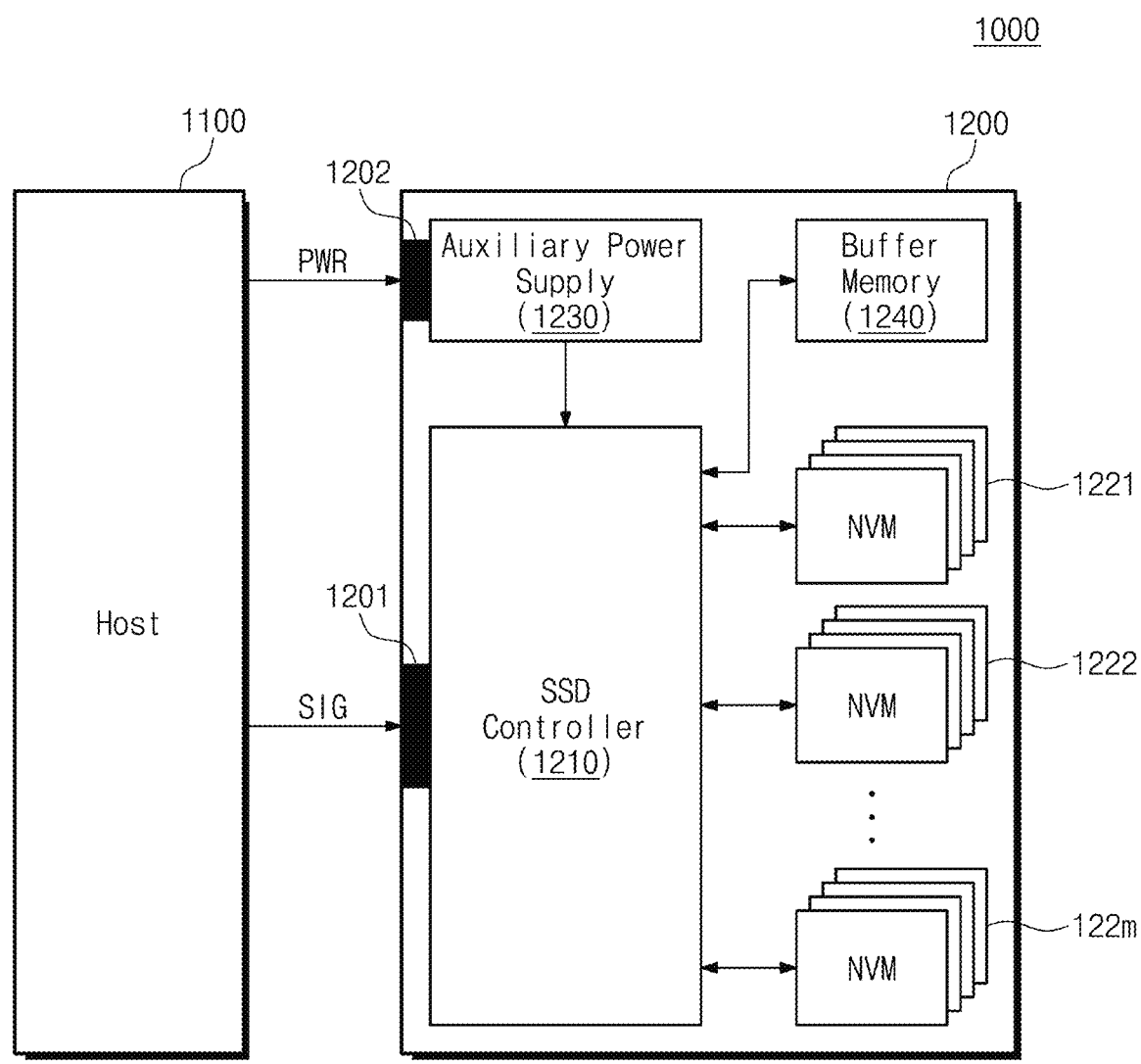
FIG. 23 is a block diagram illustrating an SSD system to which a memory device according to an embodiment of the present disclosure is applied.

FIG. 23 is a block diagram illustrating an SSD system to which a memory device according to an embodiment of the present disclosure is applied. Referring to FIG. 23, an SSD system 1000 includes a host 1100 and an SSD 1200.

The SSD 1200 may exchange signals SIG with the host 1100 through a signal connector 1201 and may be supplied with a power PWR through a power connector 1202. The SSD 1200 may include an SSD controller 1210, a plurality of flash memories 1221 to 122m, an auxiliary power supply 1230, and a buffer memory 1240. The plurality of flash memories 1221 to 122m may be connected with the SSD controller 1210 through a plurality of channels.

The SSD controller 1210 may control the plurality of flash memories 1221 to 122m in response to the signals SIG from the host 1100. The SSD controller 1210 may store signals internally generated or signals transferred from the outside (e.g., the signals SIG received from the host 1100) in the buffer memory 1240. The SSD controller 1210 may be implemented with the memory controller described with reference to FIGS. 1 to 21. For example, in the case where the plurality of flash memories 1221 to 122*m* operate in the first mode, the SSD controller 1210 may transmit the command/address CMD/ADDR through pins the same as pins for transmitting the data "DATA" in one channel. In the case where the plurality of flash memories 1221 to 122*m* operate in the second mode, the SSD controller 1210 may transmit the command/address CMD/ADDR through pins different from the pins for transmitting the data "DATA" in one channel.

The plurality of flash memories 1221 to 122*m* may operate under control of the SSD controller 1210. The auxiliary power supply 1230 is connected with the host 1100 through the power connector 1202. Each of the plurality of flash memories 1221 to 122*m* may be implemented with the memory device described with reference to FIGS. 1 to 21. For example, each of the plurality of flash memories 1221 to 122*m* may receive the command/address CMD/ADDR through pins the same as pins for receiving the data "DATA" in the first mode and may receive the command/address CMD/ADDR through pins different from pins for receiving the data "DATA" in the second mode.

The auxiliary power supply 1230 may be connected with the host 1100 through the power connector 1202. The auxiliary power supply 1230 may be charged by the power PWR supplied from the host 1100. When the power PWR is not smoothly supplied from the host 1100, the auxiliary power supply 1230 may power the SSD 1200.

Figure 24:
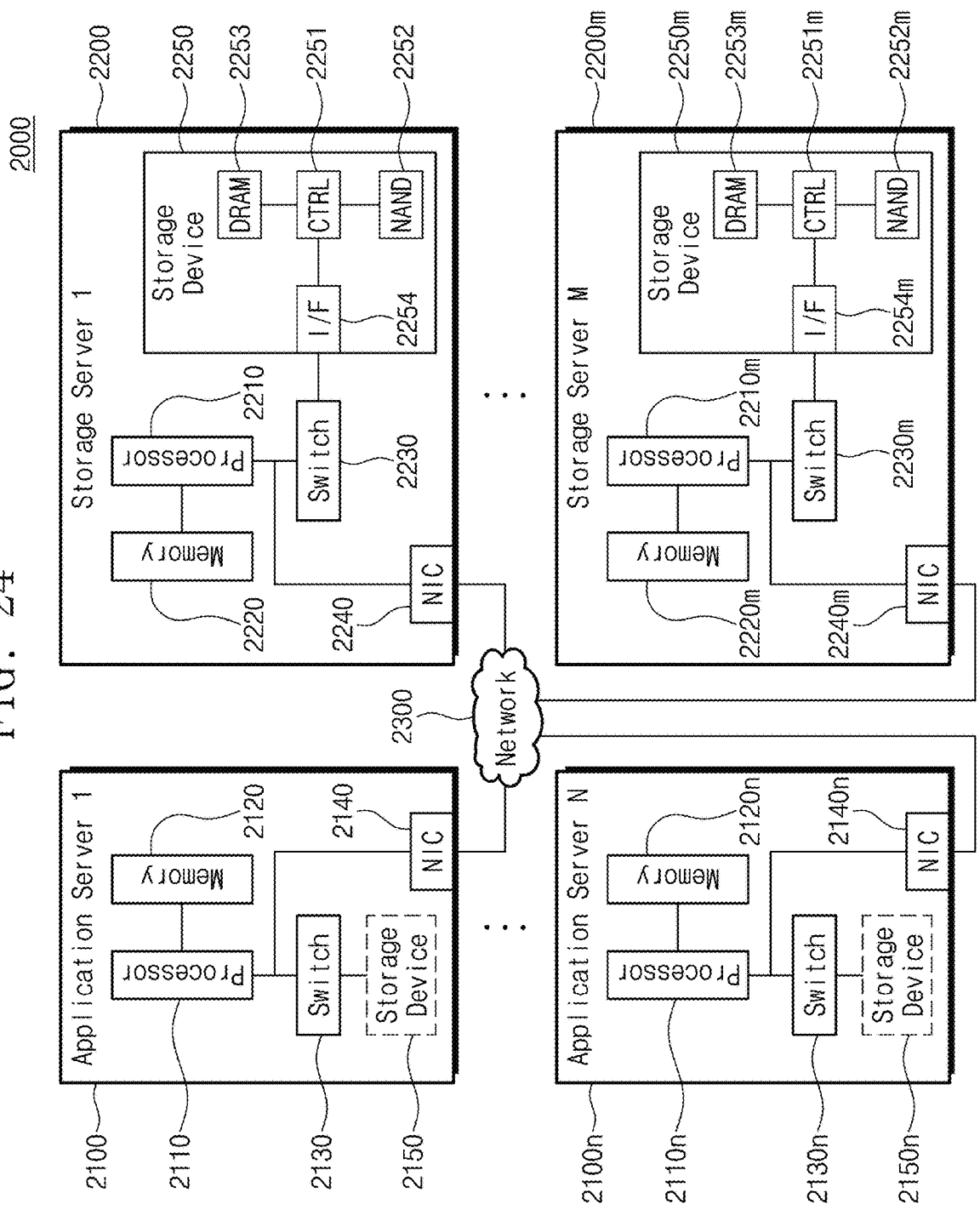
FIG. 24 is a block diagram illustrating a network system to which a memory system according to an embodiment of the present disclosure is applied.

FIG. 24 is a block diagram illustrating a network system to which a memory system according to an embodiment of the present disclosure is applied. Referring to FIG. 24, a network system 2000 that is a facility to store various kinds of data and provide a service may be referred to as a "data center" or a "data storage center". The network system 2000 may include application servers 2100 to 2100*n* and storage servers 2200 to 2200*m*, and the application servers 2100 to 2100*n* and the storage servers 2200 to 2200*m* may be referred as "computing nodes". The number of application servers 2100 to 2100*n* and the number of storage servers 2200 to 2200*m* may be variously selected according to embodiments, and the number of application servers 2100 to 2100*n* and the number of storage servers 2200 to 2200*m* may be different.

The application servers 2100 to 2100*n* and the storage servers 2200 to 2200*m* may communicate with each other through a network 2300. The network 2300 may be implemented by using, for example, a Fibre Channel (FC) or an Ethernet. In this case, the FC may be a medium used for high-speed data transmission and may use an optical switch providing high performance/high availability. The storage servers 2200 to 2200*m* may be provided as file storage, block storage, or object storage according to an access manner of the network 2300.

In an exemplary embodiment, the network 2300 may be a storage-dedicated network such as a storage area network (SAN). For example, the SAN may be an FC-SAN using an FC network and implemented in compliance with the FC protocol (FCP). In an exemplary embodiment, the SAN may be an IP-SAN using a TCP/IP protocol and implemented in compliance with the iSCSI (SCSI over TCP/IP or Internet SCSI) protocol. In an exemplary embodiment, the network 2300 may be a general network such as a TCP/IP network. For example, the network 2300 may be implemented in compliance with a protocol such as FCoE (FC over Ethernet), NAS (Network Attached Storage), or NVMe-oF (NVMe over Fabrics).

Below, the application server 2100 and the storage server 2200 will be mainly described. The description of the application server 2100 may be applied to another application server 2100*n*, and the description of the storage server 2200 may be applied to another storage server 2200*m*.

The application server 2100 may include a processor 2110 and a memory 2120. The processor 2110 may control overall operations of the application server 2100 and may access the memory 2120 to execute an instruction and/or data loaded onto the memory 2120. According to an embodiment, in the application server 2100, the number of processors 2110 and the number of memories 2120 may be variously selected. In an exemplary embodiment, the processor 2110 and the memory 2120 may be composed of a processor-memory pair. In an exemplary embodiment, the number of processors 2110 and the number of memories 2120 may be differently selected.

The application server 2100 may further include a storage device 2150. In this case, the number of storage devices 2150 included in the application server 2100 may be variously selected according to embodiments. The processor 2110 may provide the storage device 2150 with a command, and the storage device 2150 may operate in response to the command received from the processor 2110. However, the present disclosure is not limited thereto. For example, the application server 2100 may not include the storage device 2150.

The application server 2100 may further include a switch 2130 and a network interface card (NIC) 2140. Under control of the processor 2110, the switch 2130 may selectively connect the processor 2110 and the storage device 2150 or may selectively connect the NIC 2140 and the storage device 2150. The NIC 2140 may include a wired interface, a wireless interface, a Bluetooth interface, an optical interface, and the like. In an exemplary embodiment, the processor 2110 and the NIC 2140 may be integrated into one device. In an exemplary embodiment, the storage device 2150 and the NIC 2140 may be integrated into one device.

The application server 2100 may store data, which a user or a client requests the application server 2100 to store, in one of the storage servers 2200 to 2200*m* through the network 2300. Also, the application server 2100 may obtain data, which the user or the client requests the application server 2100 to read, from one of the storage servers 2200 to 2200*m* through the network 2300. For example, the application server 2100 may be implemented with a Web server, a database management system (DBMS), or the like.

The application server 2100 may access a memory 2120*n* or a storage device 2150*n* included in another application server 2100*n* through the network 2300 or may access memories 2220 to 2220*m* or storage devices 2250 to 2250*m* included in the storage servers 2200 to 2200*m* through the network 2300. As such, the application server 2100 may perform various operations on data stored in the application servers 2100 and 2100*n* and/or the storage servers 2200 and 2200*m*. For example, the application server 2100 may execute an instruction for moving or copying data between the application servers 2100 and 2100*n* and/or the storage servers 2200 and 2200*m*. In this case, the data may be moved through the network 2300 in a state of being encrypted for security or privacy.

The storage server 2200 may include a processor 2210 and the memory 2220. The processor 2210 may control overall operations of the storage server 2200 and may access the memory 2220 to execute an instruction and/or data loaded onto the memory 2220. According to an embodiment, in the storage server 2200, the number of processors 2210 and the number of memories 2220 may be variously selected. In an exemplary embodiment, the processor 2210 and the memory 2220 may be composed of a processor-memory pair. In an exemplary embodiment, the number of processors 2210 and the number of memories 2220 may be differently selected.

The processor 2210 may include a single core processor or a multi-core processor. For example, the processor 2210 may include a general-purpose processor, a CPU (Central Processing Unit), a GPU (Graphic Processing Unit), a DSP (Digital Signal Processor), an MCU (Microcontroller), a microprocessor, a network processor, an embedded processor, an FPGA (field programmable gate array), an ASIP (application-specific instruction set processor), an ASIC (application-specific integrated circuit processor), or the like.

The storage server 2200 may further include at least one storage device 2250. The number of storage devices 2250 included in the storage server 2200 may be variously selected according to embodiments. The storage device 2250 may include a controller (CTRL) 2251, a NAND flash (NAND) 2252, a dynamic random access memory (DRAM) 2253, and an interface (I/F) 2254. Below, a configuration and an operation of the storage device 2250 will be more fully described. The following description of the storage device 2250 may be applied to the remaining storage devices 2150, 2150n, and 2250m.

An interface 2254 may provide a physical connection of the processor 2210 and the controller 2251 and a physical connection of an NIC 2240 and the controller 2251. For example, the interface 2254 may be implemented in a direct attached storage (DAS) manner of directly connecting the storage device 2250 with a dedicated cable. Also, for example, the interface 2254 may be implemented in various interface manners such as ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI express), NVMe (NVM express), IEEE 1394, USB (universal serial bus), SD (secure digital) card, MMC (multi-media card), eMMC (embedded multi-media card), and CF (compact flash) card interfaces.

The controller 2251 may control overall operations of the storage device 2250. The controller 2251 may program data in the NAND flash 2252 in response to a program command or may read data from the NAND flash 2252 in response to a read command. For example, the program command and/or the read command may be provided through the processor 2210 from the processor 2110 in the storage server 2200, a processor 2210m of another storage server 2200m, or the processors 2110 and 2110n in the application servers 2100 and 2100n or may be directed provided therefrom.

The NAND flash 2252 may include a plurality of NAND flash memory cells. However, the present disclosure is not limited thereto. For example, the storage device 2250 may include any other nonvolatile memory, for example, a resistive RAM (ReRAM), a phase change RAM (PRAM), or a magnetic RAM (MRAM), in addition to the NAND flash 2252 or may include a magnetic storage medium, an optical storage medium, or the like.

The DRAM 2253 may be used as a buffer memory. For example, the DRAM 2253 may be a DDR SDRAM (Double Data Rate Synchronous DRAM), an LPDDR (Low Power DDR) SDRAM, a GDDR (Graphics DDR) SDRAM, an RDRAM (Rambus DRAM), or an HBM (High Bandwidth Memory). However, the present disclosure is not limited thereto. For example, the storage device 2250 may use, as a buffer memory, any other volatile memory or nonvolatile memory in addition to a DRAM. The DRAM 2253 may temporarily store (or buffer) data to be programmed in the NAND flash 2252 or data read from the NAND flash 2252.

The storage server 2200 may include a switch 2230 and the NIC 2240. Under control of the processor 2210, the switch 2230 may selectively connect the processor 2210 and the storage device 2250 or may selectively connect the NIC 2240 and the storage device 2250. In an exemplary embodiment, the processor 2210 and the NIC 2240 may be integrated into one device. In an exemplary embodiment, the storage device 2250 and the NIC 2240 may be integrated into one device.

The storage devices 2150, 2150n, 2250, and 2250m may correspond to the memory system described with reference to FIGS. 1 to 21. For example, the controller 2251 may transfer the command/address CMD/ADDR to the NAND flash 2252 in response to a request provided from one of the processors 2110, 2110n, 2210, and 2210m. In this case, when the NAND flash 2252 operates in the first mode, the controller 2251 may transmit the command/address CMD/ADDR through pins the same as pins for transmitting the data "DATA". When the NAND flash 2252 operates in the second mode, the controller 2251 may transmit the command/address CMD/ADDR through pins different from the pins for transmitting the data "DATA".

A nonvolatile memory device according to an embodiment of the present disclosure may support a high-efficiency input/output interface capable of transmitting data to a memory controller or receive data from the memory controller while receiving a command or an address from the memory controller.

The nonvolatile memory device according to an embodiment of the present disclosure may selectively support a legacy input/output interface in addition to the high-efficiency input/output interface. As such, a nonvolatile memory device with interface compatibility may be provided.

While the present disclosure has been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
   first pins configured to receive a plurality of control signals including a first control signal and a second control signal from a memory controller;
   a second pin configured to receive a write enable signal from the memory controller;
   third pins configured to receive data signals from the memory controller;
   a memory cell array; and
   a memory interface circuit,
   wherein, according to the control signals received during a first cycle period and a second cycle period of a time period including a predetermined number of cycle periods, the memory interface circuit is configured to obtain a command or an address from the first control signal and the second control signal received during remaining cycle periods of the time period,
   wherein, when the first control signal and the second control signal received during the first and the second cycle periods are in a first state, the memory interface circuit obtains the command from the first control signal and the second control signal received during the remaining cycle periods based on a toggle timing of the write enable signal, and wherein, when the first control signal and the second control signal received during the first and the second cycle periods are in a second state, the memory interface circuit obtains the address from the first control signal and the second control signal received during the remaining cycle periods based on a toggle timing of the write enable signal.

2. The nonvolatile memory device of claim 1, wherein the first state and the second state are different from each other.

3. The nonvolatile memory device of claim 1, wherein, when the first control signal received during a first cycle period is in an enable state, the memory interface circuit obtains the command from the first control signal and the second control signal received during the remaining cycle periods based on a toggle timing of the write enable signal.

4. The nonvolatile memory device of claim 3, wherein the second control signal received during a first cycle period is in a disable state.

5. The nonvolatile memory device of claim 1, wherein, when the first control signal received during a first cycle period is in a disable state, the memory interface circuit obtains the address from the first control signal and the second control signal received during the remaining cycle periods based on the toggle timing of the write enable signal.

6. The nonvolatile memory device of claim 5, wherein the second control signal received during a first cycle period is in a disable state.

7. The nonvolatile memory device of claim 1, wherein the predetermined number of cycle periods are six cycle periods.

8. The nonvolatile memory device of claim 1, wherein a frequency of the write enable signal is smaller than a frequency of the first control signal and the second control signal.

9. A memory device including a first nonvolatile memory device and a second nonvolatile memory device comprising:

first pins configured to receive a plurality of control signals including a first control signal and a second control signal from a memory controller;

a second pin configured to receive a data strobe signal from the memory controller;

third pins configured to receive data signals from the memory controller; and a first memory interface circuit configured to transmit a first status information of the first nonvolatile memory device to the memory controller through at least one of the first pins in response to a first status read command from the memory controller; and a second memory interface circuit configured to transmit a second status information of the second nonvolatile memory device to the memory controller through at least one of the first pins in response to a second status read command from the memory controller, wherein while data are transferred from the first nonvolatile memory device to the memory controller through the third pins, the second status information of the second nonvolatile memory device is provided from the second nonvolatile memory device to the memory controller through at least one of the first pins.

10. The memory device of claim 9, wherein the first memory interface circuit includes:

a first flip-flop configured to generate a first sampled signal based on the first control signal and the data strobe signal;

a second flip-flop configured to generate a second sampled signal based on the second control signal and the data strobe signal; and a third flip-flop configured to generate a third sampled signal based on the data signals and the data strobe signal.

11. The memory device of claim 10, wherein, in a first mode, the first sampled signal includes information indicating whether the third sampled signal includes a command, the second sampled signal includes information indicating whether the third sampled signal includes an address, and the third sampled signal includes the command or the address.

12. The memory device of claim 11, wherein, in a second mode, the first sampled signal includes information indicating whether the first and second sampled signals include a command, and the second sampled signal includes information indicating whether the first and second sampled signals include an address.

13. The memory device of claim 10, wherein the first memory interface circuit includes a converter configured to:

bypass the first sampled signal, the second sampled signal, the third sampled signal, and the data strobe signal in a first mode, and generate a recovered command latch enable signal based on the first sampled signal, to generate a recovered address latch enable signal based on the second sampled signal, to generate a recovered command/address signals based on the third sampled signal, and to generate a recovered data strobe signal based on the data strobe signal in a second mode.

14. The memory device of claim 13, wherein the converter includes:

a divider configured to divide the data strobe signal to generate internal clock signals having different phases and generate the recovered data strobe signal having a same phase as one of the internal clock signals;

a spreader configured to generate a sampled command latch enable signal based on the internal clock signals and the first sampled signal, a sampled address latch enable signal based on the internal clock signals and the second sampled signal, and a sampled command/address signal based on the first sampled signal and the second sampled signal;

a fourth flip-flop configured to generate the recovered command latch enable signal based on the sampled command latch enable signal and the recovered data strobe signal;

a fifth flip-flop configured to generate the recovered address latch enable signal based on the sampled address latch enable signal and the recovered data strobe signal; and a sixth flip-flop configured to generate the recovered data strobe signal based on the sampled command/address signal and the recovered data strobe signal.

15. The memory device of claim 13, wherein the converter includes:

a first multiplexer configured to output the bypassed first sampled signal or the recovered command latch enable signal according to a mode selection signal;

a second multiplexer configured to output the bypassed second sampled signal or the recovered address latch enable signal according to the mode selection signal;
a third multiplexer configured to output the bypassed third sampled signal or the recovered command/address signals according to the mode selection signal; and
a fourth multiplexer configured to output a bypassed fourth sampled signal or the recovered data strobe signal according to the mode selection signal.

16. The memory device of claim 15, wherein the converter includes:
a command cycle generator configured to generate a command cycle signal based on an output signal of the first multiplexer and an output signal of the fourth multiplexer; and
an address cycle generator configured to generate an address cycle signal based on an output signal of the second multiplexer and the output signal of the first multiplexer.

17. A nonvolatile memory device comprising:
first pins configured to receive control signals including a first control signal and a second control signal from a memory controller, the control signals being received during a first cycle period, a second cycle period, and remaining cycle periods of a time period;
a second pin configured to receive a data strobe signal from the memory controller;
third pins configured to receive data signals from the memory controller; and
a memory interface circuit,
wherein the memory interface circuit obtains a command from the control signals received during the remaining cycle periods in response to the control signals received during the first cycle period and the second cycle period being in a first state, and
wherein the memory interface circuit obtains an address from the control signals received during the remaining cycle periods in response to the control signals received during the first cycle period and the second cycle period being in a second state.

18. The nonvolatile memory device of claim 17, wherein first state and the second state are different from each other.

19. The nonvolatile memory device of claim 17, wherein, when the first control signal received during a first cycle period is in an enable state, the memory interface circuit obtains the command from the control signals received during the remaining cycle periods based on the toggle timing of the data strobe signal.

20. The nonvolatile memory device of claim 17, wherein, when the first control signal received during a first cycle period is in a disable state, the memory interface circuit obtains the address from the control signals received during the remaining cycle periods based on the toggle timing of the data strobe signal.

* * * * *